United States Patent
Merritt

(10) Patent No.: US 11,763,906 B2
(45) Date of Patent: Sep. 19, 2023

(54) DEGRADATION SIGNALING FOR A MEMORY DEVICE

(71) Applicant: Micron Technology, Inc., Boise, ID (US)

(72) Inventor: Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

(21) Appl. No.: 16/227,393

(22) Filed: Dec. 20, 2018

(65) Prior Publication Data

US 2020/0202965 A1 Jun. 25, 2020

(51) Int. Cl.
*G11C 16/34* (2006.01)
*H03L 7/099* (2006.01)
(Continued)

(52) U.S. Cl.
CPC ........ *G11C 16/3495* (2013.01); *G06F 3/0653* (2013.01); *G06F 3/0659* (2013.01);
(Continued)

(58) Field of Classification Search
CPC ... G11C 16/3495; G11C 16/349; G11C 7/222; G11C 16/08; G11C 16/10; G11C 16/26; G11C 16/32; G11C 7/04; G11C 11/4078; G11C 11/4074; G11C 11/40626; G11C 29/02; G11C 29/023; G11C 29/12015; G11C 29/20; G11C 29/4401; G11C 29/46; G11C 29/52; G06F 12/0246; G06F 3/0653; G06F 3/0659; H03L 7/0995
See application file for complete search history.

(56) References Cited

U.S. PATENT DOCUMENTS 10,114,068 B1 * 10/2018 Chen .................. G01R 31/2879
2005/0134394 A1 * 6/2005 Liu .................. G01R 31/31703
331/57
(Continued)

FOREIGN PATENT DOCUMENTS

CN 101849264 A 9/2010

OTHER PUBLICATIONS

Poorvi, Jain et al., Within-Die Threshold Voltage Variability Estimation Using Reconfigurable Ring Oscillator, 2017 30th International Conference on VLSI Design and 2017 16th International Conference on Embedded Systems (VLSID), Jan. 7-11, 2017 (Year: 2017).*

(Continued)

*Primary Examiner* — Arpan P. Savla
*Assistant Examiner* — Edmund H Kwong
(74) *Attorney, Agent, or Firm* — Holland & Hart LLP

(57) ABSTRACT

Methods, systems, and devices for degradation signaling for a memory device are described. In one example, a method in accordance with the described techniques may include monitoring, at a memory device, an operational characteristic of the memory device. For example, the threshold voltage of one or more transistors within the memory device may be monitored. The memory device may identify a degradation of the memory device based at least in part on the monitored operational characteristic. Based on identifying the degradation, the memory device may signal, to a host device, an indication of the degradation of the memory device.

18 Claims, 13 Drawing Sheets

(51) Int. Cl.
    *G11C 16/08*           (2006.01)
    *G11C 16/10*           (2006.01)
    *G11C 16/32*           (2006.01)
    *G11C 7/22*            (2006.01)
    *G06F 3/06*            (2006.01)
    *G11C 16/26*           (2006.01)

(52) U.S. Cl.
    CPC .............. *G11C 7/222* (2013.01); *G11C 16/08* (2013.01); *G11C 16/10* (2013.01); *G11C 16/26* (2013.01); *G11C 16/32* (2013.01); *H03L 7/0995* (2013.01)

(56) References Cited

U.S. PATENT DOCUMENTS

| | | | | |
|---|---|---|---|---|
| 2006/0049886 A1* | 3/2006 | Agostinelli | ............... | H03L 1/00 331/175 |
| 2008/0035921 A1* | 2/2008 | Gonzalez | ........... | G01R 31/2884 257/48 |
| 2009/0033355 A1* | 2/2009 | Hsu | .................... | G01R 31/2621 324/750.3 |
| 2009/0037782 A1* | 2/2009 | Hughes | ................ | G11C 29/02 714/53 |
| 2009/0273550 A1* | 11/2009 | Vieri | ................... | G09G 3/3648 345/87 |
| 2010/0306580 A1* | 12/2010 | McKean | ................ | G11C 29/76 714/6.13 |
| 2011/0122699 A1 | 5/2011 | Ha et al. | | |
| 2013/0147562 A1* | 6/2013 | Brochu, Jr. | .......... | H03K 3/0315 331/44 |
| 2014/0022008 A1* | 1/2014 | Noorlag | ............. | G01R 31/2856 327/540 |
| 2014/0123085 A1* | 5/2014 | Shroff | ..................... | G06F 30/20 716/102 |
| 2014/0226398 A1* | 8/2014 | Desireddi | .......... | G11C 16/3436 365/185.03 |
| 2014/0359198 A1* | 12/2014 | Zaltsman | ............. | G06F 3/0653 711/103 |
| 2016/0104539 A1* | 4/2016 | Kim | ....................... | G11C 16/28 365/185.12 |
| 2018/0081774 A1 | 3/2018 | Kawamura et al. | | |
| 2018/0246159 A1* | 8/2018 | Huynh | ................. | G01R 31/129 |
| 2018/0330796 A1* | 11/2018 | Tsubo | ...................... | G11C 8/12 |
| 2018/0364911 A1* | 12/2018 | Gupta | ..................... | G06F 3/0632 |
| 2019/0080765 A1* | 3/2019 | Fujiwara | .................... | G11C 8/10 |

OTHER PUBLICATIONS

Chinese Patent Office, "Office Action," issued in connection with Chinese Patent Application No. 201911318850.5 dated Mar. 27, 2023 (7 pages).

\* cited by examiner

DEGRADATION SIGNALING FOR A MEMORY DEVICE

BACKGROUND

The following relates generally to a system that includes at least one memory device and more specifically to degradation signaling for a memory device.

Memory devices are widely used to store information in various electronic devices such as computers, wireless communication devices, cameras, digital displays, and others. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Components of a memory device may degrade, which over time may cause operations of the memory device to fail. For example, a memory device may degrade to a point where the memory device may no longer support accurate or reliable reading, writing, rewriting, or refreshing of information, or may not support such access operations being performed at a desired or designed rate. Such failures may impact the ability of a host device to perform a desired or designed function. Improved signaling is desired.

DETAILED DESCRIPTION

Figure 1:
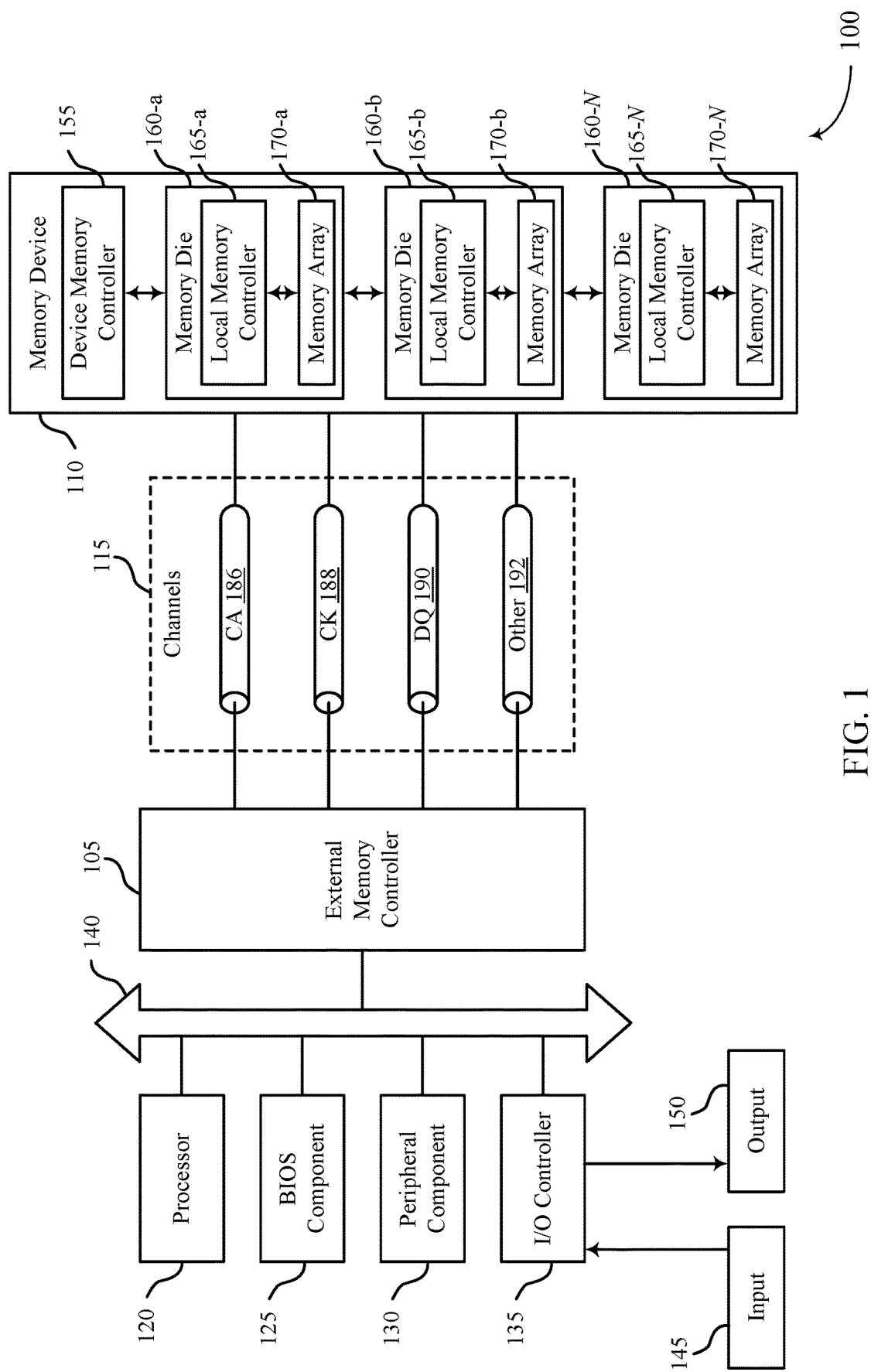
FIG. 1 illustrates an example of a system that supports degradation signaling for a memory device in accordance with examples as disclosed herein.

Components of a memory device may degrade over time, which may cause operations of a memory device to fail. For example, a memory device may include various transistors (e.g., p-channel transistors, n-channel transistors) which each may be associated with a particular threshold voltage for activating the transistor (e.g., for enabling a conductive path between other nodes of the transistor such as a source or drain). Over time, the threshold voltage of a transistor may change (e.g., due to physical degradation of the transistor, due to channel hot carrier (CHC) degradation, due to bias temperature instability such as negative bias temperature instability (NBTI)), which may affect whether a transistor is activated with a particular activation voltage, or may affect how much current will pass through a transistor with a particular activation voltage. When threshold voltages of transistors change over time, related operations of the memory device may also change (e.g., be delayed, be performed more slowly, not be performed), which, in some examples, may lead to degraded operation of a memory device.

In some examples, degradation of a memory device (e.g., degradation of one or more components of a memory device) may, over time, lead to unacceptable (e.g., unreliable) operation of the memory device, which in turn may lead to unacceptable operation of a host device that relies on the memory device for information storage. In one example, a memory device may be hosted by a vehicle controller (e.g., a vehicle safety controller, a vehicle braking controller, a controller associated with autonomous driving), and degradation of the memory device may lead to impaired operation of the vehicle controller, or an inability to support operations of the vehicle controller. In some examples, degradation of a memory device over time may lead to the operation of a host device failing entirely.

In accordance with examples of the present disclosure, a memory device may provide signaling to a host device that indicates a degradation of the memory device. The signaling may provide an early indicator or warning to the host device, indicating that the memory device has identified some aspect of degradation, such as a physical degradation, damage, a change in composition of one or more constituent components of the memory device, and irreversible or irrecoverable impairment or loss of function, and others.

Conditions or thresholds for the described identification of such degradation may be configured such that the memory device may still support operations, even in the degraded state (e.g., a partially degraded state or condition). In other words, degradation of a memory device may be detected prior to failure of the memory device, and a flag may be signaled (e.g., to a host device) prior to the memory device reaching or experiencing a point of failure. Thus, the signaling may be used to indicate that the memory device should be replaced (e.g., physically replaced with a new memory device), but the memory device may continue to provide at least some support of the desired or designed functionality of the memory device. In some examples, the host device may receive such signaling and generate an indication of the degradation, such as an indication to a user that the memory device should be replaced.

Features of the disclosure are initially described in the context of a memory system and memory die as described with reference to FIGS. 1 and 2. Features of the disclosure are described in the context of example systems and components as described with reference to FIGS. 3-6. These and other features of the disclosure are further illustrated by and described with reference to an apparatus diagrams and flowcharts that relate to degradation signaling for a memory device as described with references to FIGS. 7-13.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device, a vehicle, and others. The system 100 may be an example of a portable electronic device. The system 100 may be an example of a computer, a laptop computer, a tablet computer, a smartphone, a cellular phone, a wearable device, an internet-connected device, a vehicle, or others. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, a vehicle, or others. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses or other space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, gates, decoders, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or others.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may, in some cases, be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any number of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., non-return-to-zero (NRZ), pulse amplitude modulation (PAM) having some number of symbols, such as PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors).

In some cases, the memory device 110 may utilize different clock signals, and the different clock signals may be generated at the memory device 110 based on a reference clock signal (e.g., a clock signal, a write clock signal, a signal from an external memory controller 105, a signal from a host device). For example, a memory device 110 may include an input or output interface (e.g., of a device memory controller 155) that utilizes a data strobe, where the data strobe may be a clock signal generated based on a reference clock signal. In some examples, the memory device 110 may include a delay component or circuitry (e.g., of a device memory controller 155, of a local memory controller 165) that generates an clock signal, which may include a delay locked loop (DLL). In some examples, a DLL may be configured to synchronize rising edges of a generated clock signal (e.g., internal to the memory device 110) with rising edges of a received clock signal (e.g., as received over a CK channel or WCK channel). In some examples, a memory device 110 may include a clock distribution system (e.g., of a device memory controller 155, of a local memory controller 165), which may include a clock tree (e.g., before a DLL, after a DLL, in a forward path of a feedback loop, or in some other configuration of a clock distribution system).

In some examples, an input buffer of a memory device 110 may be included in a clock input circuit configured to receive external clock signals (e.g., at a device memory controller 155). For example, when enabled by a clock enabling signal (e.g., a CKE signal) from a command decoder, an input buffer can receive clock signals from the host device 105 (e.g., external clock signals, which may include signals referred to as CK signals, CKF signals, WCK signals, WCKF signals). The clock input circuit may receive the clock signals to generate internal clock signals (e.g., clock signals internal to the memory device 110, which may include signals referred to as ICLK signals), which may be generated using components such as a DLL, a clock tree, or other components. Internal clock signals can be supplied to an internal clock circuit (e.g., internal to the memory device 110). Such an internal clock circuit may provide various phase and frequency controlled internal clock signals based on the received internal clock signals and a clock enable signal from a command address input circuit. For example, the internal clock circuit can include a clock path that receives the internal clock signal and provides various clock signals to the command decoder. The internal clock circuit can further provide I/O clock signals. The I/O clock signals can be used as a timing signal for determining an output timing of read data and the input timing of write data. In some examples, I/O clock signals can be provided at multiple clock frequencies so that data can be output from and input to the memory device 110 at different data rates. A higher clock frequency may be desirable when high memory speed is desired. A lower clock frequency may be desirable when lower power consumption is desired. The internal clock signals can also be supplied to a timing generator and thus various internal clock signals can be generated (e.g., by a device memory controller 155, by a local memory controller 165).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, NRZ, unipolar encoding, bipolar encoding, Manchester encoding, PAM having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Components of the memory device 110 may degrade over time, which may cause operations of the memory device 110 to fail. For example, the memory device 110 may include various transistors (e.g., p-channel transistors, which may be referred to as p-type transistors or p-channel metal-oxide semiconductor (PMOS) transistors, or n-channel transistors, which may be referred to as n-type transistors or n-channel metal-oxide semiconductor (NMOS) transistors) which each may be associated with a particular threshold voltage for activating the transistor. Over time, the threshold voltage of a transistor may change (e.g., due to physical degradation of the transistor, due to carrier hot channel (CHC) degradation, due to bias temperature instability such as negative bias temperature instability (NBTI)), which may affect whether a not a transistor is activated with a particular activation voltage, how quickly a transistor is activated, or how much current will pass through a transistor for a particular activation voltage. When threshold voltages of transistors change over time, related operations of the memory device 110 may also change (e.g., be delayed, be performed more slowly, not be performed), which, in some examples, may lead to degraded operation of the memory device 110. Although described with reference to degradation of transistors, other components of a memory device (e.g., capacitors, inductors, resistors, amplifiers, gates) may experience various degradation, which, in some examples, may also lead to degraded operation of the memory device.

In some examples, degradation of a memory device 110 (e.g., degradation of one or more components of a memory device 110, degradation of one or more components of a device memory controller 155, a memory die 160, a local memory controller 165, or a memory array 170) may, over time, lead to unacceptable or undesirable (e.g., unreliable) operation of the memory device 110, which in turn may lead to unacceptable or undesirable operation of a host device that relies on the memory device 110 for information storage. In one example, a memory device 110 may be hosted by a vehicle controller (e.g., an example of, or otherwise including an external memory controller 105), and degradation of the memory device 110 may lead to impaired operation of the vehicle controller, or an inability to support operations of the vehicle controller, which may be associated with vehicle safety issues. In some examples, degradation of the memory device 110 over time may lead to the operation of a host device failing entirely, which may be of particular concern in applications with heightened reliability or safety requirements, such as safety systems or mission critical systems.

In one example of components of a memory device 110 that may experience degradation, a DLL or clock tree of the memory device 110 may include various transistors or other components configured for synchronizing a generated clock signal (e.g., by a device memory controller 155, by a local memory controller 165, internal to a memory device 110) with received clock signals (e.g., as received at a memory device 110 via a channel 115). In some examples, transistors of a DLL or clock tree may be configured to synchronize rising edges of clock signals, synchronize falling edges of clock signals, or both. In some examples, transistors of a DLL or clock tree may be configured to equalize a time between a rising edge and a subsequent falling edge to a time between a falling edge and a subsequent rising edge, which may be referred to as equalizing a "duty cycle" of a clock signal.

As transistors of a DLL or clock tree degrade, operations of the DLL or clock tree, such as the described synchronization or equalization, may become degraded. For example, where certain components of a DLL or clock tree are configured in an open loop configuration, the duty cycle of a generated clock signal may become distorted over time (e.g., where a duration between a rising edge and a subsequent falling edge is different than a duration between a falling edge and a subsequent rising edge) due to transistor degradation. Such degradation may be related to a DLL or clock tree being held in a standby mode or hold mode over time, which may degrade transistors that are affected by stresses from being held in such a mode (e.g., NBTI stress or degradation of p-type transistors being operated with a constant voltage differential between a gate node and a source or drain node). Thus, as transistors of the DLL or clock tree degrade (e.g., in response to being held in a standby or hold mode over time), timing of various access operations of the memory device 110 may also degrade.

In accordance with examples of the present disclosure, a memory device 110 may provide signaling to a host device (e.g., signaling over a channel 115 to an external memory controller 105, such as a data channel or diagnostic channel) that indicates a degradation of the memory device 110. The signaling may provide an early indicator or warning to the host device, indicating that the memory device 110 has identified some aspect of degradation, such as a physical degradation or damage of the memory device 110, or a change in composition of one or more constituent components of the memory device 110 (e.g., one or more transistors, capacitors, inductors, resistors, amplifiers, gates). For example, the memory device 110 may monitor various operational characteristics of the memory device 110, and identify a degradation of the memory device 110 based at least in part on the monitored operational characteristics. In some examples, such functionality may be provided as or otherwise described as an on-chip degradation monitor of the memory device 110 (e.g., of a device memory controller 155, of a local memory controller 165), and such functionality may be referred to as in-situ degradation monitoring or on-chip degradation monitoring.

The conditions or thresholds for identifying such a degradation may be configured such that the memory device 110 may still support operations (e.g., performing access operations requested by or otherwise supporting the host device), even in the degraded state. Thus, the signaling may be used to indicate that the memory device 110 should be replaced, but the memory device 110 may continue to provide at least some, if not full support, of the desired or designed functionality of the memory device 110 (e.g., as relied upon by the host device). In some examples, the host device may receive such signaling over a channel 115 and generate an indication of the degradation, such as an indication to a user that the memory device 110, or device that includes the memory device 110, should be replaced (e.g., over an output 150).

Figure 2:
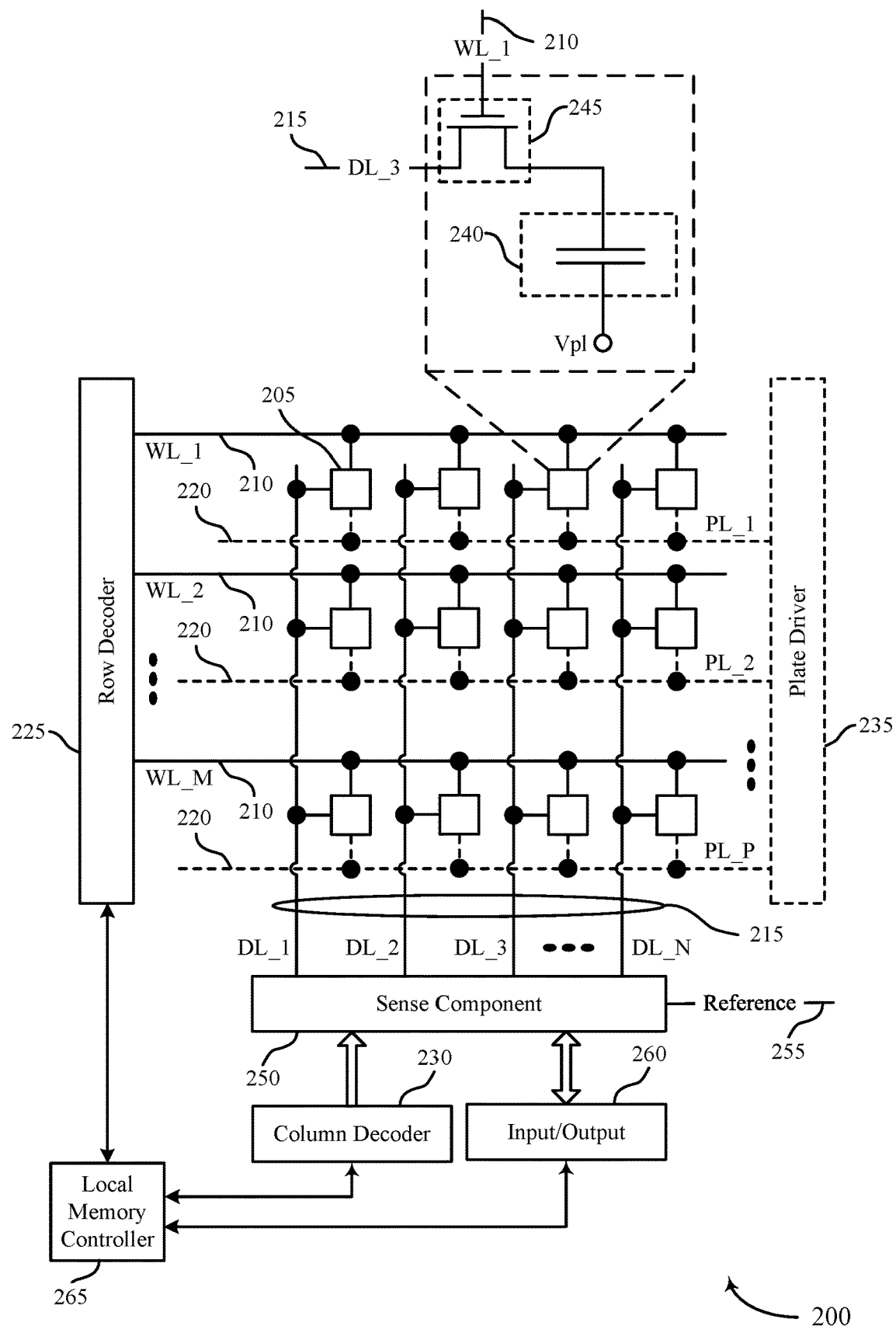
FIG. 2 illustrates an example of a memory die that supports degradation signaling for a memory device in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or (e.g., in the case of FeRAM) a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and—if present—the plate lines 220) arranged in a grid-like pattern. Memory cells 205 may be positioned at intersections of the word lines 210, the digit lines 215, and/or the plate lines 220. Although illustrated as separate lines, in some examples, the plate lines 220 may represent or be otherwise functionally equivalent with a common plate line, a common plate, or other common node of the memory die 200 (e.g., a node common to each of the memory cells 205 in the memory die 200, a common plate of the capacitors 240 of the memory cells 205). In some examples (e.g., when the plate lines 220 represent a common plate or common node of the memory die 200), the plate driver 235 as well as individual plate lines 220 may be omitted from the memory die 200. By biasing a word line 210, a digit line 215, and—if present—a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and—if present—a plate driver 235. For example, a row decoder 225 may receive a row address from the local memory controller 265 and activate a word line 210 based on the received row address. A column decoder 230 may receive a column address from the local memory controller 265 and activate a digit line 215 based on the received column address. If present, a plate driver 235 may receive a plate address from the local memory controller 265 and activate a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and in some cases a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a linear capacitor or a ferroelectric capacitor. A first node of the capacitor 240 may be coupled with the switching component 245 and a second node of the capacitor 240 may be coupled with a plate component, such as a fixed cell plate reference voltage (e.g., fixed at Vpl, which may in some cases correspond to a ground voltage) or a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

Where present, a plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to detect a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). In some examples, such as some DRAM architectures, the reference signal 255 (e.g., a reference voltage) may be provided by, or otherwise refer to the voltage of another digit line 215 not coupled with a memory cell 205.

The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be part of another component (e.g., a column decoder 230, row decoder 225). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and—if applicable—the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

In some examples, operation of the memory die 200 may cause components of the memory die 200 (e.g., transistors, capacitors, inductors, resistors, amplifiers, gates) to degrade over time. For example, one or more of a row decoder 225, a column decoder 230, a plate driver 235, a sense component 250, or a local memory controller 265 may include components that are susceptible to a wear-out mechanism that cause physical changes (e.g., physical degradation, change of composition, irreversible change in operation, irrecoverable change in operation, damage) in response to the components being operated. Transistors of the memory die 200, for example, may be associated with one or more wear-out mechanisms that cause a change in threshold voltage of the transistors, which may be associated with a degradation as a result of voltage being applied to gate nodes (e.g., complementary metal oxide semiconductor (CMOS) gates) of the transistors.

In another example of components of a memory device 110 that may experience degradation, a row decoder 225 or a local memory controller 265 may include various transistors for selecting or activating rows (e.g., word lines 210) of the memory die 200. In some examples, a row selection transistor may be an n-type transistor configured to selectively activate or deactivate a particular word line 210 of the memory die. Successive activations of the row selection transistor may cause a change (e.g., an irreversible change, an irrecoverable change) in threshold voltage of the row selection transistor, which may degrade timing of various access operations of the memory die 200 (e.g., causing read or write errors when activating or deactivating the associated word line 210 of the memory die 200).

One example of a degradation that may be experienced by components of the memory die 200 is channel hot carrier (CHC) degradation, which may refer to n-channel or p-channel transistor aging caused by channel impact-ionization. For example, an electron may enter a channel of a transistor from a source while the transistor is operating in a saturated condition. The channel electron may undergo impact ionization in the E-horizontal region, which may cause an electron-hole pair. Electrons and holes may be swept, and in some cases, some electrons may inject into oxide and form traps. In some examples, CHC stress may be associated with degradation of transistor (e.g., an n-type transistor, a p-type transistor) by causing an increased threshold voltage, a decreased conductivity (e.g., decreased drain current), decreased transconductance, and others. In some examples, such degradation may limit a transistor's ability to form a channel, or cause a transistor to be harder to turn on and easier to turn off.

Another example of a degradation that may be experienced by components of the memory die 200 is negative bias temperature instability (NBTI) degradation, which may refer to a p-channel interface state generation, or hole trapping in the gate oxide for p-channel devices in inversion. In some examples, NBTI stress may be associated with degradation of a transistor by causing an increased threshold voltage or decreased conductivity, particularly for p-type transistors. For example, when a DLL or clock tree associated with the memory die 200 includes a p-type transistor, NBTI stress related to the DLL or clock tree being held in a standby, hold, or idle state may result in a duty cycle distortion of a clock signal associated with the DLL or clock tree. A related example of degradation (e.g., another type of bias temperature instability) is positive bias temperature instability (PBTI), which may also cause increased threshold voltage or decreased conductivity, particularly for n-type transistors.

In accordance with examples of the present disclosure, a memory device 110 that includes the memory die 200 may identify a degradation of the memory die 200, and subsequently provide signaling to a host device that indicates the identified degradation. The signaling may provide an early indicator or warning to the host device, indicating some aspect of degradation of the memory die 200 (e.g., a physical degradation, an indication of CHC degradation, an indication of NBTI degradation, an indication that a threshold voltage of a transistor has changed, an indication that the memory die 200 or the memory device 110 should be replaced).

Figure 3:
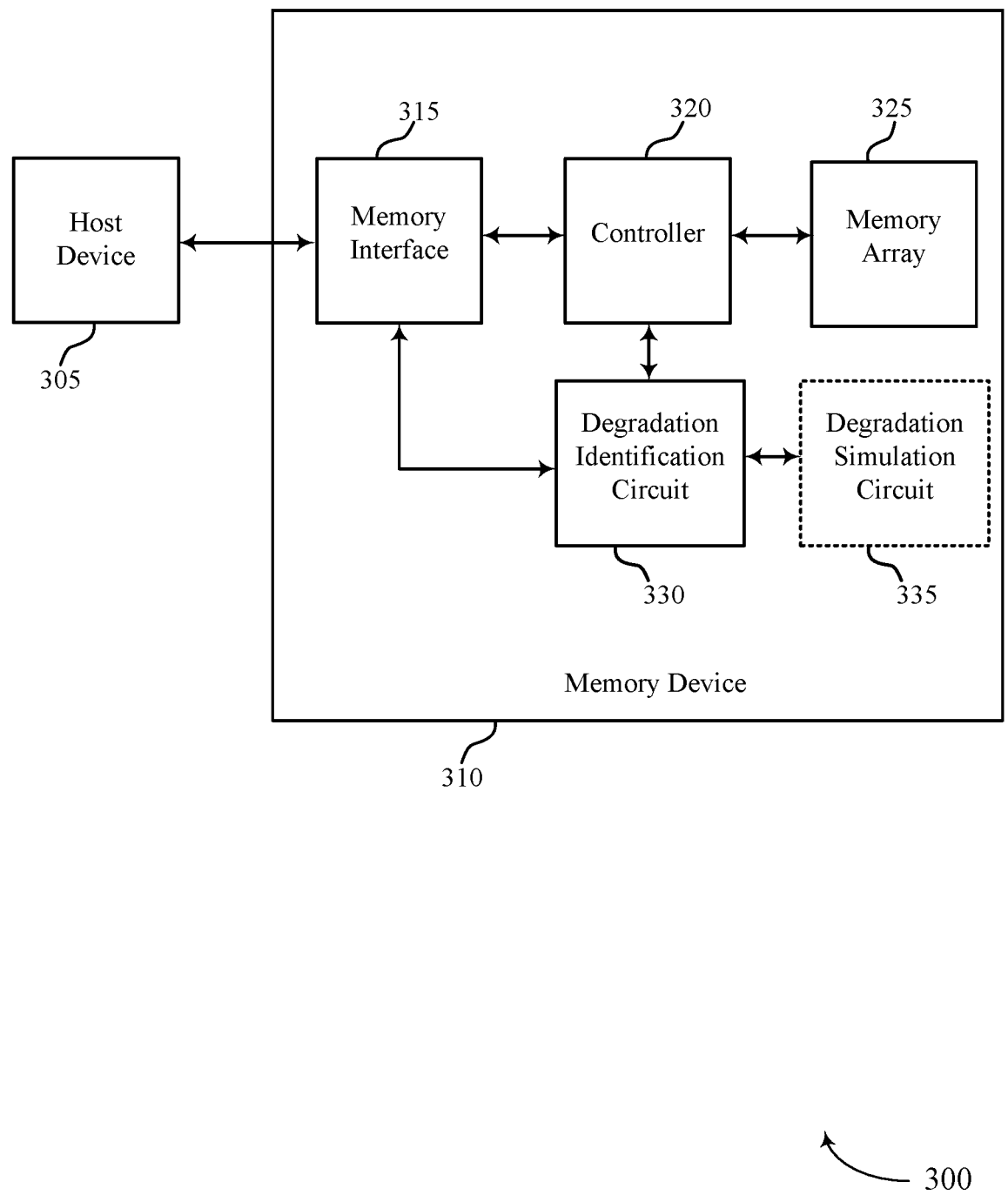
FIG. 3 illustrates an example of a system that supports degradation signaling for a memory device in accordance with examples as disclosed herein.

FIG. 3 illustrates an example of a system 300 that supports degradation signaling for a memory device in accordance with examples of the present disclosure. The system 300 may include one or more components described herein with reference to FIGS. 1 and 2. For example, the system 300 may include a host device 305, which may be an example of, or include an external memory controller 105 as described with reference to FIG. 1. The system 300 may also include a memory device 310, which may be an example of the memory device 110, the memory dice 160, or the memory die 200 as described with reference to FIGS. 1 and 2.

The memory device 310 may include a memory interface 315, a controller 320, and memory array 325. The memory interface 315 may be configured to support communication signaling between the host device 305 and the memory device 310. For example, the memory interface 315 may be configured to communicate with the host device 305 via channels 115 described with reference to FIG. 1 (e.g., to transmit signaling to the host device 305, to receive signaling from the host device 305). In some examples, the memory interface 315 may include, or refer to circuitry included in a device memory controller 155 or an input/output 260 described with reference to FIGS. 1 and 2.

The controller 320 may be configured to control various operations of the memory device 310, including accessing the memory array 325 (e.g., supporting read operations, write operations, rewrite operations, or refresh operations with the memory array 325). In various examples, the controller 320 may include, include or otherwise refer to circuitry that supports the operation of a device memory controller 155, a local memory controller 165, a local memory controller 265, a row decoder 225, a column decoder 230, a plate driver 235, a sense component 250, or an input/output 260, or any combination thereof, described with reference to FIGS. 1 and 2.

The memory array 325 may be an example of a memory array 170 described with reference to FIG. 1. The memory array 325 include an array of memory cells, such as memory cells 205 described with reference to FIG. 2. The memory cells may be arranged according to various access lines, such as those described herein (e.g., word lines 210, digit lines 215, plate lines 220), for accessing particular memory cells. In some examples, the memory array 325 may include, or otherwise refer to circuitry that supports the operation of a row decoder 225, a column decoder 230, a plate driver 235, a sense component 250, an input/output 260, or a local memory controller 265, or any combination thereof, described with reference to FIG. 2.

The host device 305 may send commands to the memory device 310, which may be received via the memory interface 315. The commands may include individual row access commands (e.g., individual read or write commands), or burst commands (multiple sequential row or column access commands). The controller 320 may include various processors or other circuitry to receive the commands from the memory interface 315, process the commands, and execute the commands on the memory array 325. The memory array 325 may include one or more memory banks, each of which may comprise one or more rows and/or one or more columns. Each command may include an access command that may include an activation (e.g., read, write, etc.) for an address within the memory array 325. The controller 320 may execute multiple access commands (e.g., an access command pattern) on the memory array 325, thus accessing a pattern of banks, rows, and/or columns within the memory array 325.

The memory device 310 may also include a degradation identification circuit 330, which may include a processor or other circuit components configured to monitor one or more operational characteristics of the memory device 310, and identify a degradation of the memory device 310 (e.g., one or more components of the memory device 310) based at least in part on the monitored operational characteristic. For example, the degradation identification circuit 330 may be configured to identify or otherwise predict or detect a presence of CHC degradation, NBTI degradation, or other types of physical degradation (e.g., compositional changes, irreversible change of operation, irrecoverable change of operation, damage) of one or more components of the memory device 310. In some examples, the degradation identification circuit 330 may be configured to identify a degradation of one or more transistors (e.g., a p-type transistor, an n-type transistor) of the memory device 310, such as a change in threshold voltage, a change in conductivity, a change in rate of activation, or others. In some examples, a degradation identification circuit 330 may additionally or alternatively be configured to identify degradation of other circuitry or components that support access operations of the memory device 310, such as capacitors, inductors, resistors, amplifiers, gates, and others.

In some examples, the degradation identification circuit 330 may be configured to directly monitor for degradation of components of the memory device 310, such as directly monitoring row selection transistors, a DLL, or a clock tree of the memory device 310 (e.g., of a row decoder 225, of a local memory controller 265, of the controller 320, of the memory array 325). For example, the degradation identification circuit 330 may directly monitor a threshold voltage of a row selection transistor, and identify a change in the threshold voltage over time or after a set of operations of the row selection transistor (e.g., a change identified to be associated with CHC stress or other compositional change or physical degradation). In some examples, such monitoring may include a comparison of a threshold voltage of a monitored transistor with a threshold voltage of a reference transistor, where a reference transistor may include a transistor that does not experience the same stresses as the monitored transistor (e.g., an unstressed transistor, a lightly-stressed transistor). In some examples, such monitoring may include a comparison of a threshold voltage of a monitored transistor with a reference voltage (e.g., a reference voltage source), or other identification that a threshold voltage of the transistor satisfies a threshold or that a change of the threshold voltage exceeds a threshold change.

In some examples, the degradation identification circuit 330 may identify a presence or probability of a degradation by monitoring via another component (e.g., a proxy) used to detect or predict such degradation of the memory device 310. For example, the memory device 310 may include a degradation simulation circuit 335, which may include one or more components configured to simulate a degradation of one or more other components of the memory device 310 (e.g., simulate degradation of transistors of the memory device 310, simulate a degradation of a DLL or clock tree of the memory device 310). In various examples, the degradation simulation circuit 335 may include components that are stressed similarly to, or otherwise based on stresses on one or more components of the memory device 310, which may include activating or energizing a component of the degradation simulation circuit 335 based on (e.g., in response to) various operations performed on or by the memory device 310 (e.g., access operations), or modes that the memory device 310 is operated in (e.g., idle modes, hold modes, standby modes). In some examples, such monitoring may include a comparison of an operation of a simulation component with an operation of a reference component, where a reference component may include a component that does not experience the same stresses as the simulation component (e.g., an unstressed component, a lightly-stressed component).

In one example, a component of the degradation simulation circuit 335 may include a simulation transistor that simulates degradation of one or more row selection transistors, where the simulation transistor itself may not be used to support access operations (e.g., may not be directly involved in accessing a particular memory cell of the memory array 325). In some examples, the simulation transistor may be activated each time a particular row transistor is activated (e.g., each time a particular row is selected), such that the simulation transistor experiences the same or similar stresses as the particular row transistor (e.g., similar CHC stresses, such as when the particular row transistor is an n-type transistor). Such a simulation may require a relatively large amount of components (e.g., when simulating each row selection transistor of the memory device 310), or be associated with relatively high power consumption, but may provide relatively detailed simulation of the degradation experienced by the memory device 310. In some examples, such a one-to-one simulation may be applied to a subset of row selection transistors of the memory device 310, which may reduce complexity or power consumption associated with degradation simulation.

In some examples, a simulation transistor may be activated each time any one of a set of row selection transistors is activated (e.g., each time any one of a set of rows are selected, each time a row associated with a particular local row decoder is selected, each time a local row decoder is activated). Such a simulation may require relatively fewer components than a one-to-one simulation, and may cause the simulation transistor to be stressed more than any one particular row selection transistor. Thus, such a many-to-one simulation may reflect a worst-case degradation, such as simulating a scenario where one of the row selection transistors in the set was repeatedly activated (e.g., in a row hammer scenario). In other words, a many-to-one degradation simulation may provide a relatively conservative estimate of degradation, which may flag a possible degradation earlier than what the simulated component(s) may be experiencing. Such a treatment may be overly-conservative, so in some examples, a simulation transistor may be activated for some fraction of a set of row activations of a set of rows (e.g., every other activation, every third activation, every tenth activation, some other ratio), which may be designed or configured based on statistical analysis of various operational conditions that may be experienced by the memory device 310. In some examples, such a fractional approach may be supported with a flip-flop or other circuitry that supports an output or activation signal being generated for some fraction of a number of input signals.

In another example, a component of the degradation simulation circuit 335 may include a simulation transistor or other circuitry that simulates degradation of one or more DLL components or clock trees of the memory device 310, where the simulation transistor or other circuitry itself may not be used to support a particular clock signal generation. In some examples, the simulation transistor or other circuitry may be activated each time the memory device 310 is operated in an idle or standby mode. For example, the simulation transistor or other circuitry may be held in an activated state (e.g., a stress-application state) over the same duration that the memory device is held in the idle or standby mode, which may support simulation of NBTI stresses or degradation when a DLL or clock tree includes a p-type transistor that remains activated during the idle or standby mode.

In some examples, the described comparisons may be provided by a differential amplifier (e.g., an operational amplifier (op-amp), an op-amp reader). For example, an output of an op amp reader may be activated when a threshold voltage of a monitored transistor satisfies a threshold (e.g., when the monitored threshold voltage is above a threshold, when the monitored threshold voltage is below a threshold). In some examples, the monitored threshold voltage itself may be provided as an input to such an op amp reader, and another input to the op amp reader may be a reference threshold voltage (e.g., from a fixed or variable reference voltage source). In some examples, the monitored threshold voltage may refer to a voltage applied to a gate of a monitored transistor, and the output of the monitored transistor (e.g., a drain voltage of the monitored transistor) may be provided as an input to such an op amp reader. In such cases, another input to the op amp reader may be a reference voltage (e.g., from a fixed or variable reference voltage source) that is compared to the output of the monitored transistor to determine whether the monitored transistor is activated.

Based on identifying a degradation of the memory device 310 (e.g., via direct monitoring by the degradation identification circuit 330, by monitoring degradation simulation circuit 335), the degradation identification circuit 330 may support indicating the identified degradation to the host device 305. In some examples, the degradation identification circuit 330 may provide signaling directly to the host device 305 (e.g., via memory interface 315). In some examples, the degradation identification circuit 330 may provide an indication to the controller 320, which, in turn, may provide signaling to the host device 305 (e.g., via memory interface 315). The signaling may be conveyed over a channel, such as channels 115 described with reference to FIG. 1 (e.g., a data channel, a DQ channel, a JTAG channel). In some examples, the controller 320 may additionally modify operation of the memory device 310 based on the indication from the degradation identification circuit 330 (e.g., modifying access operations of the memory array 325).

The signaling indicative of the degradation may be received by the host device 305, which may be interpreted as an indication that the memory device 310 should be replaced, or that the memory device 310 should be operated in a different manner (e.g., accessed less frequently, accessed under certain conditions, accessed at a slower rate), or both. In some examples, the host device 305 may generate an indication associated with the degradation, such as an indication to a user, that the memory device 310 should be replaced (e.g., that a user should uninstall the memory device 310 and install a replacement memory device). For example, in a vehicle application, the host device 305 (e.g., a vehicle controller, a vehicle system) may receive signaling indicative of a degradation of the memory device 310, and provide a visual indication to a user (e.g., a check engine light, a controller fault light) on a dashboard of the vehicle. Thus, the user of the vehicle may be warned that the vehicle needs to be serviced (e.g., for replacement of the memory device 310, for replacement of a control module that includes the memory device 310).

The described signaling and indications may provide an early indicator or warning to the host device 305, where such functionality may be referred to as in-situ degradation monitoring or on-chip degradation monitoring. Thus, the signaling may refer to signaling that the memory device 310 is operating in a degraded condition. The conditions or thresholds used by the degradation identification circuit 330 may be configured such that the memory device 310 may still support operations (e.g., performing access operations requested by or otherwise supporting the host device 305), even after identifying the degradation. In other words, the memory device 310 may continue operating after signaling an indication of a degradation to the host device 305. Thus, the signaling may be used to indicate that the memory device 310 should be replaced, but the memory device 310 may continue to provide at least some, if not full support of the desired or designed functionality of the memory device 110 (e.g., as relied upon by the host device).

The signaling and indications described herein may be provided in the system 300 according to various conditions or triggers. For example, the host device 305 may be configured to poll the memory device 310 periodically (e.g., according to a time interval, according to an access history, according to operational triggers, according to initialization operations), and the memory device 310 may receive such a polling as a trigger for the degradation identification circuit 330 to perform a degradation identification operation, or as a trigger for the degradation identification circuit 330 or the controller 320 to recall a result from a prior degradation identification operation (e.g., as stored in a storage component of the memory device 310, such as a non-volatile memory or fuse of the memory device 310). In some examples, polling may be triggered by a user (e.g., as triggered by a human issuing a command), or by a resident application of the host device 305 (e.g., as triggered by a monitoring application run on the host device 305). Thus, according to various examples, the memory device 310 may perform various degradation identification operations, or provide signaling associated with whether the memory device 310 has degraded, or both, in response to a request received from a host device 305 (e.g., via memory interface 315).

In some examples, the memory device 310 may trigger various degradation detection or signaling internally. For example, the degradation identification circuit 330 may be configured to perform degradation identification operations periodically (e.g., according to a time interval, according to an access history, according to operational triggers, according to initialization operations). Thus, in some examples, the memory device 310 may perform various degradation identification operations proactively (e.g., without necessarily receiving a request from a host device 305). Likewise, in some examples, the memory device may perform various signaling operations proactively. For example, the memory device 310 may signal an degradation as soon as the degradation is identified (e.g., in response to satisfying a threshold, such as a threshold voltage being above a predetermined voltage).

Although the memory device 310 is illustrated as including a single degradation identification circuit 330 and a single degradation simulation circuit 335, many configurations are possible in accordance the techniques described herein. For example, a memory device 310 may have a first degradation simulation circuit 335 associated with a first degradation (e.g., CHC degradation) and a second degradation simulation circuit 335 associated with a second degradation (e.g., NBTI degradation). Further, a degradation simulation circuit 335 may be distributed throughout different portions of a memory device 310, or a memory device 310 may include multiple discrete degradation simulation circuits 335 distributed throughout the memory device 310. For example, when a memory device 310 includes a row decoder (e.g., row decoder 225) associated with multiple local row drivers, each of the local row drivers may be associated with one or more particular degradation simulation circuits 335, which, in some examples, may be located relatively near to the respective local row driver. In various examples, each of a set of multiple degradation simulation circuits 335 may be associated with its own degradation identification circuit 330 (e.g., a one-to-one mapping between degradation simulation circuits 335 and degradation identification circuits 330), or a set of degradation simulation circuits 335 may be associated with a shared degradation identification circuit 330 (e.g., a many-to-one mapping between degradation simulation circuits 335 and degradation identification circuits 330).

Figure 4:
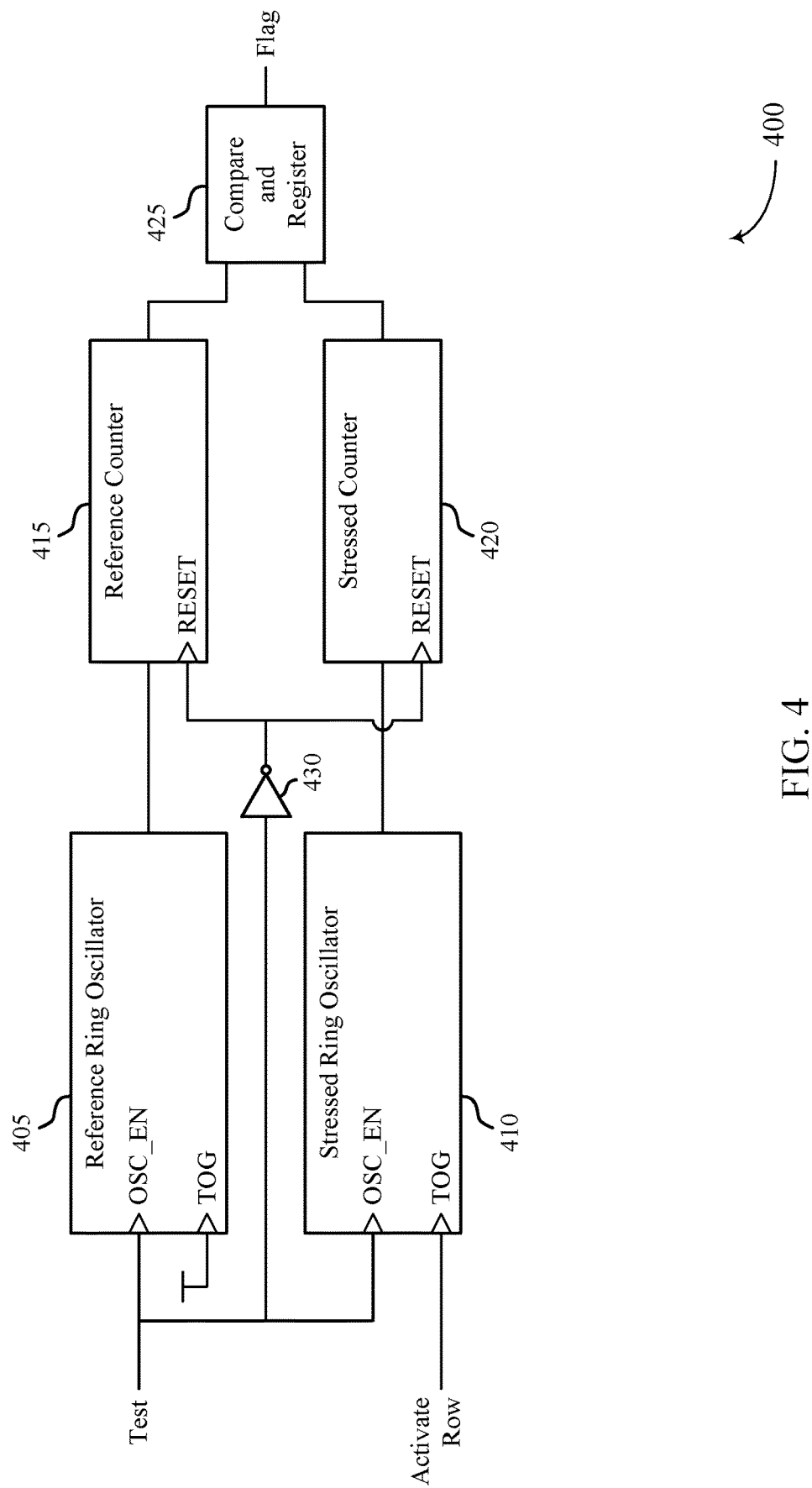
FIG. 4 illustrates an example of a circuit that supports degradation signaling for a memory device in accordance with examples as disclosed herein.

FIG. 4 illustrates an example of a circuit 400 that supports degradation signaling for a memory device in accordance with examples as disclosed herein. The circuit 400 may be included in a memory device (e.g., a memory device 110 or 310 described with reference to FIGS. 1 and 3), and may include a reference ring oscillator 405, a stressed ring oscillator 410, a reference counter 415, a stressed counter 420, and a compare and register 425. In some examples, the circuit 400 may support monitoring degradation of transistors of a memory device, such as a CHC degradation of n-type transistors of the memory device (e.g., row selection transistors).

The reference ring oscillator 405 (e.g., a reference component of a memory device) and the stressed ring oscillator 410 (e.g., a degradation simulation component of a memory device) may include various configurations of a ring oscillator. For example, the reference ring oscillator 405 and the stressed ring oscillator 410 may include chained inverters with a feedback loop from the last inverter of the chain to the first inverter of the chain. Aspects of such a configuration may be illustrated by the ring oscillator 600 described with reference to FIG. 6, though various other configurations of a ring oscillator may support described operations of the circuit 400. Each of the chained inverters may include a transistor configured to support degradation monitoring of a memory device, such as simulating operation or stress experienced by another component of the memory device. Accordingly, the stressed ring oscillator 410 may be an example of a degradation simulation circuit 335 described with reference to FIG. 3. The reference ring oscillator 405 (e.g., a reference component), the reference counter 415, the stressed counter 420, the compare and register 425, or combinations thereof, may be examples of a degradation identification circuit 330 described with reference to FIG. 3.

The circuit 400 may be configured to monitor degradation of circuitry that is stressed by a change in activation state (e.g., a transition from being deactivated to being activated), such as transistors that are stressed by a change in voltage applied to the gate of the transistor. For example, the circuit 400 may be configured to monitor degradation of one or more row activation transistors (e.g., n-type transistors) of a memory device. To support such degradation monitoring, the stressed ring oscillator 410 may be stressed or activated each time, or some subset of the times, a monitored row activation transistor is activated (e.g., each time a single row activation transistor is activated, each time or a fraction of the times any one of a set of row activation transistors is activated, each time or a fraction of the times a local row driver is activated).

Row activations of a memory device may activate or otherwise enable the "Activate Row" signal, which may activate or otherwise apply stress to the stressed ring oscillator 410. In some examples, the "Activate Row" signal may cause one or more transistors of the stressed ring oscillator 410 to be activated, such that the transistors of the stressed ring oscillator 410 may accumulate stress each time or each instance the "Activate Row" signal is activated. For example, the stressed ring oscillator 410 may receive the "Activate Row" signal at a toggle input (e.g., "TOG"), which may cause each of the chained inverters to flip state. In other words, transistors of the stressed ring oscillator 410 may accumulate stress based at least in part on row activations of a memory device. By comparison, the reference ring oscillator 405 may receive a constant voltage at a comparable toggle input (e.g., rather than an "Activate Row" signal that changes state according to operation of the memory device), and accordingly the reference ring oscillator may not accumulate the same stress as the stressed ring oscillator 410 (e.g., accumulate less stress).

To identify stress or degradation of the memory device, operation of the stressed ring oscillator 410 may be compared with operation of the reference ring oscillator 405 (e.g., relatively unstressed or lightly stressed component or circuitry of the memory device). In the example of circuit 400, the comparison may include a comparison of a speed of the stressed ring oscillator 410 to a speed of the reference ring oscillator 405. For example, to identify potential degradation of row activation transistors, the memory device (e.g., a controller 320, a degradation identification circuit 330) may enable a "Test" signal, which may be received at both the reference ring oscillator 405 and the stressed ring oscillator 410 at an enabling input (e.g., "OSC EN"). The "Test" signal may be activated for some duration (e.g., a degradation identification interval), which may correspond to a duration that the ring oscillators remain in an oscillating state.

During an oscillating state, the chained inverters each of the reference ring oscillator 405 and the stressed ring oscillator 410 may be continuously activated and deactivated (e.g., changing or flipping states), according to the configuration of chaining. For example, the "Test" signal may be provided to an input of a first inverter (e.g., an enabled input), and may be flipped to an inverted output (e.g., a disabled output). The inverted output of the first inverter may be fed to the input of a second inverter and likewise flipped to an inverted output (e.g., an enabled output of the second inverter). Such a process of chained inversion may continue through however many inverters are chained together in the respective ring oscillator. The output of the last inverter in the chain may be a disabled output in the case of an odd number of inverters, which may be fed back to the first inverter. Thus, after a duration for each of the inverters of the chain to perform their respective inversion operation, the first inverter may be fed with a disabled input, which may cause the output of the first inverter to flip (e.g., as an enabled output of the first inverter, compared with the initially disabled output of the first inverter). In other words, the process of chained signal inversion (e.g., flipping states of each of the inverters) may continue as long as the "Test" signal is enabled.

In the example of circuit 400, the output of the last of the chained inverters of respective ring oscillators may be provided to a respective counter. For example, the output of the last inverter of the reference ring oscillator 405 may be provided to the reference counter 415, and the output of the last inverter of the stressed ring oscillator 410 may be provided to the stressed counter 420. Each of the reference counter 415 and the stressed counter 420 may be configured to count a number of times an input signal has a particular transition, such as counting falling edges, rising edges, or both. Thus, each of the reference counter 415 and the stressed counter 420 may be configured to track an indication of how many times the output of the respective ring oscillator has changed state, which may be associated with a number of flip-flop cycles the respective ring oscillator has undergone (e.g., for a particular duration that the "Test" signal is enabled).

The speed at which the reference ring oscillator 405 and the stressed ring oscillator operate (e.g., how quickly each of a set of chained inverters flips state, how quickly an output of a final inverter of the chain flips state, how quickly the ring oscillator completes a full inversion cycle) may be based at least in part on whether components of the respective ring oscillator have degraded or otherwise accumulated stress. For example, each of the chained inverters of the ring oscillators may include n-type transistors, which may experience CHC degradation (e.g., in response to row activations of a memory device, in response to the "Activate Row" signal being activated). In some examples, chained inverters with CHC degradation may undergo inversions less quickly than chained inverters without CHC degradation. Thus, when the stressed ring oscillator 410 has experienced conditions associated with CHC stresses (e.g., associated with row activations of the memory device), the stressed ring oscillator 410 may operate less quickly than, for example, the reference ring oscillator 405, which has not experienced stressors associated with row activations of a memory device. More generally, in order to simulate degradation of transistors of a memory device (e.g., CHC degradation of row selection transistors), the stressed ring oscillator 410 may be configured to operate more slowly as the memory device accumulates transistor activations (e.g., as row selection transistors accumulate activations that may be associated with CHC stresses).

The compare and register 425 may be an example of a component or circuitry configured to identify a degradation by comparing an operation of a monitored component of a memory device (e.g., the stressed ring oscillator 410, which in turn may be considered as a component of the memory device configured to monitor degradation another component used to support access operations of the memory device) to an operation of a reference component of the memory device (e.g., the reference ring oscillator 405). For example, when the "Test" signal is disabled, each of the reference counter 415 and the stressed counter 420 may be held at a RESET state (e.g., due to an inversion of the disabled "Test" signal by the inverter 430), and accordingly each of the reference counter 415 and the stressed counter 420 may have a zero or otherwise initialized count when the "Test" signal is disabled. Upon activation of the "Test" signal, both the reference ring oscillator 405 and the stressed ring oscillator 410 may be activated (e.g., enabled in an oscillating state). As the last of the chained inverters of each of the reference ring oscillator and the stressed ring oscillator change states, the respective counter may accumulate counts (e.g., while the signal to the RESET input is disabled, due to an inversion of the "Test" signal by the inverter 430), which are subsequently reported to the compare and register 425. In the event that the stressed ring oscillator 410 has accumulated stress, and accordingly operates less quickly than an unstressed ring oscillator, the stressed counter 420 may register a lower count than the reference counter 415, which may not have accumulated comparable stress.

The compare and register 425 may be configured to identify a level of memory device degradation based at least in part on a difference in counts between the stressed counter 420 and the reference counter. For example, for a given duration (e.g., a duration over which the "Test" signal is activated), the compare and register 425 may output the "Flag" signal, which may be indicative of a threshold level of degradation, when the stressed counter 420 is 5% or more below the reference counter (e.g., signaling a degradation when the stressed counter 420 is at or below 95% of the reference counter). For example, in a given duration that would be associated with 100 counts of the reference counter 415, the compare and register 425 may initiate the flag signal if the stressed counter is at or below 95 counts over the given duration. Other thresholds or conditions are possible for setting the "Flag" signal in a state or level that indicates degradation of the memory device.

In some examples, the compare and register 425 may include a storage component (e.g., a non-volatile storage, a fuse) that may store an indication of such a determination. In some examples, a memory device may include such storage in a different part of the memory device. In various examples, the "Test" signal may be activated based on operating conditions of the memory device, an interval of time, or a request received from a host device. In various examples, the indication of the "Flag" signal may be provided to a host device proactively (e.g., in response to the "Flag" signal indicating degradation), or the result of the "Flag" signal may be retrieved (e.g., from a storage component) in response to a request (e.g., from a controller 320, from a host device 305). Thus, in accordance with various examples described herein, the "Flag" signal may be used to support signaling, to a host device, an indication of a degradation of a memory device based at least in part on identifying a degradation of a memory device. When the "Test" signal is deactivated (e.g., at the end of a test interval), each of the reference counter 415 and the stressed counter 420 may return to the RESET state (e.g., returning the counters to a zero or otherwise initialized state).

Figure 5:
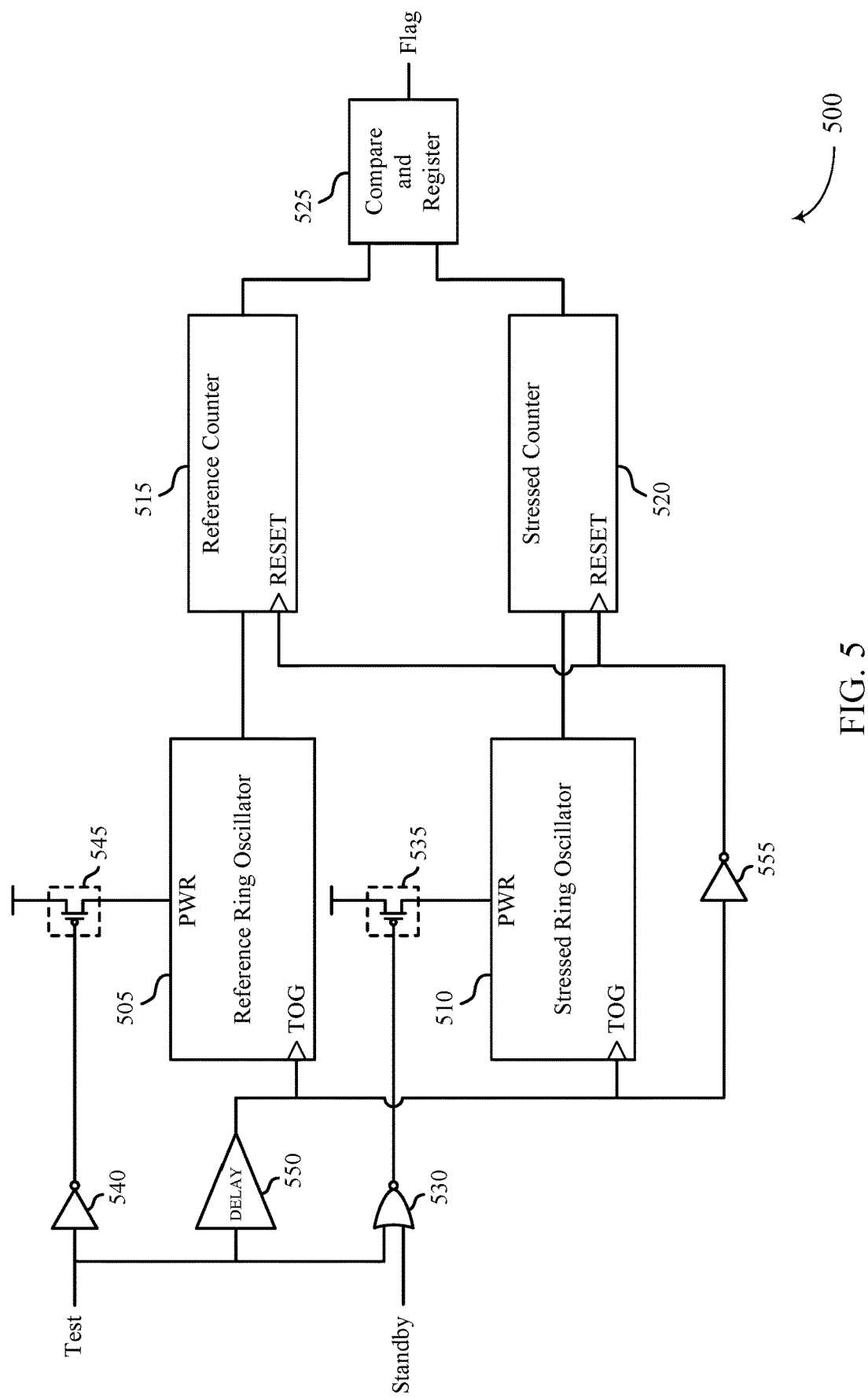
FIG. 5 illustrates an example of a circuit that supports degradation signaling for a memory device in accordance with examples as disclosed herein.

FIG. 5 illustrates an example of a circuit 500 that supports degradation signaling for a memory device in accordance with examples as disclosed herein. The circuit 500 may be included in a memory device (e.g., a memory device 110 or 310 described with reference to FIGS. 1 and 3), and may include a reference ring oscillator 505, a stressed ring oscillator 510, a reference counter 515, a stressed counter 520, and a compare and register 525. The components of the circuit 500 may share similarities with respective components of the circuit 400 described with reference to FIG. 4. In some examples, the circuit 500 may be configured to monitor different stresses or degradation than those monitored by the ring oscillator circuit 400 described with reference to FIG. 4. For example, the circuit 500 may support monitoring degradation of transistors of a memory device, such as a NBTI degradation of p-type transistors of the memory device (e.g., p-type transistors of a DLL, a clock tree, or other component used to generate a clock signal of a memory device).

The reference ring oscillator 505 (e.g., a reference component of a memory device) and the stressed ring oscillator 510 (e.g., a degradation simulation component of a memory device) may include various configurations of a ring oscillator. For example, the reference ring oscillator 505 and the stressed ring oscillator 510 may include chained inverters with a feedback loop from the last inverter of the chain to the first inverter of the chain. Aspects of such a configuration may be illustrated by the ring oscillator 600 described with reference to FIG. 6, though various other configurations of a ring oscillator may support described operations of the circuit 500. Each of the chained inverters may include a transistor configured to support degradation monitoring of a memory device, such as simulating operation or stress experienced by another component of the memory device. Accordingly, the stressed ring oscillator 510 may be an example of a degradation simulation circuit 335 described with reference to FIG. 3. The reference ring oscillator 505 (e.g., a reference component), the reference counter 515, the stressed counter 520, the compare and register 525, or combinations thereof, may be examples of a degradation identification circuit 330 described with reference to FIG. 3.

The circuit 500 may be configured to monitor degradation of circuitry that is stressed or otherwise accumulates degradation by being held at an activation state (e.g., being held in an activated state, being held in a deactivated state, being held in a powered condition), such as transistors that accumulate degradation when a voltage applied to the gate of the transistor is held over time. For example, the circuit 500 may be configured to monitor degradation of a DLL or a clock tree of a memory device, or some other component or components of a memory device that relies on p-type transistors for proper functioning. To support such degradation monitoring, the stressed ring oscillator 510 may be stressed or activated over the same duration, a similar duration, or some other duration that is based at least in part on a DLL or clock tree being held in a standby or idle state (e.g., conditions where a p-type transistor has an activation voltage held at its gate terminal). For example, the stressed ring oscillator 510 may be stressed or otherwise activated or powered when the memory device is in a standby or idle state, such as an IDD2P state or IDD3N state according to certain memory standards, which may correspond to a state where all rows (e.g., of a memory device, of a portion of a memory device associated with a particular DLL or clock tree) are precharged, a state where the memory device is powered but not supporting no data access, or conditions where the memory device is in an otherwise low current state.

For example, a standby state of a memory device may activate or otherwise enable the illustrated "Standby" signal, which may activate or otherwise apply stress to the stressed ring oscillator 510. In the example of circuit 500, the "Standby" signal may be received by a NOR gate 530, and when the "Standby" signal is activated, the output of the NOR gate 530 may be deactivated. The deactivated output of the NOR gate 530 may be received at the gate of the p-type transistor 535, which may couple the stressed ring oscillator 510 to a power source (e.g., a voltage source, coupled with the input "PWR"). The coupled power source may be provided to one or more transistors of the stressed ring oscillator 510 (e.g., to the source node of one or more transistors of the stressed ring oscillator 510, such as the source node of one or more p-type transistors of the stressed ring oscillator 510), which may cause stress to accumulate on the one or more transistors of the stressed ring oscillator 510 while the "Standby" signal is enabled. In other words, while the "Standby" signal is enabled, the stressed ring oscillator 510 may accumulate degradation, which may be based at least in part on a DLL, clock tree, or other component configured to generate or support a clock signal being held in a particular state (e.g., an idle state, a standby state, a hold state), thereby simulating degradation of the DLL, clock tree, or other component. By contrast, the reference ring oscillator 505 may not be coupled with a power source in response to the "Standby" signal being activated, and accordingly the reference ring oscillator may not accumulate such stress (e.g., because the reference ring oscillator is not powered).

To identify stress or degradation of the memory device, operation of the stressed ring oscillator 510 may be compared with operation of the reference ring oscillator 505 (e.g., relatively unstressed or lightly stressed component or circuitry of the memory device). In the example of circuit 500, the comparison may include a comparison of a speed of the stressed ring oscillator 510 to a speed of the reference ring oscillator 505. For example, to identify potential degradation of a DLL or clock tree, the memory device (e.g., a controller 320, a degradation identification circuit 330) may enable a "Test" signal, which may be received at both the NOR gate 530 and an inverter 540. The deactivated output of the NOR gate 530 may be received at the gate of the p-type transistor 535, which may couple the stressed ring oscillator 510 to a power source (e.g., a voltage source, coupled with the input "PWR"). The inverted output of the inverter 540 may be received at the gate of the p-type transistor 545, which may couple the reference ring oscillator 505 to a power source (e.g., a voltage source, coupled with the input "PWR"). In other words, in response to the "Test" signal being enabled, both the reference ring oscillator 505 and the stressed ring oscillator 510 may be in a powered-on state.

The "Test" signal may also be received at a delay component 550, which may provide a delayed activated signal after some duration (e.g., a delay duration) after receiving the activated "Test" signal. The delayed activated signal may be received at the "TOG" input of each of the reference ring oscillator 505 and the stressed ring oscillator 510, which, in the example of the circuit 500, may initiate an oscillating state of each of the ring oscillators. During the oscillating state, chained inverters each of the reference ring oscillator 505 and the stressed ring oscillator 510 may be continuously activated and deactivated (e.g., changing or flipping states), according to the configuration of chaining. The delay component 550 may support power being coupled to each of the reference ring oscillator 505 and the stressed ring oscillator for some duration prior to initiating an oscillating state, or prior to the reference counter 515 or the stressed counter 520 exiting a RESET state, which may prevent errors or inaccuracies of the circuit 500 if the order of such operations were switched, or if the order of such operations was indeterminate (e.g., due to other delays that might be associated with startup delays, different circuit path lengths, different activation delays, and others).

In the example of circuit 500, the output of the last of the chained inverters of respective ring oscillators may be provided to a respective counter. For example, similarly to the circuit 400 described with reference to FIG. 4, the output of the last inverter of the reference ring oscillator 505 may be provided to the reference counter 515, and the output of the last inverter of the stressed ring oscillator 510 may be provided to the stressed counter 520. Each of the reference counter 515 and the stressed counter 520 may be configured to count a number of times an input signal has a particular transition, such as counting falling edges, rising edges, or both. Thus, each of the reference counter 515 and the stressed counter 520 may be configured to track an indication of how many times the output of the respective ring oscillator has changed state, which may be associated with a number of flip-flop cycles the respective ring oscillator has undergone (e.g., for a particular duration that the "Test" signal is enabled, less a duration associated with the delay component 550).

The speed at which the reference ring oscillator 505 and the stressed ring oscillator operate (e.g., how quickly each of a set of chained inverters flips state, how quickly an output of a final inverter of the chain flips state, how quickly the ring oscillator completes a full inversion cycle) may be based at least in part on whether components of the respective ring oscillator have degraded. For example, each of the chained inverters of the ring oscillators may include p-type transistors, which may experience NBTI degradation (e.g., in response to a hold, idle, or standby state of a memory device, in response to the "Standby" signal being activated). In some examples, chained inverters with NBTI degradation may undergo inversions less quickly than chained inverters without NBTI degradation. Thus, when the stressed ring oscillator 510 has experienced conditions associated with NBTI stresses (e.g., associated with the memory device being in a hold, idle, or standby state), the stressed ring oscillator 510 may operate less quickly than, for example, the reference ring oscillator 505, which has not experienced stressors associated with row activations of a memory device. More generally, in order to simulate degradation of transistors of a memory device (e.g., NBTI degradation of row selection transistors), the stressed ring oscillator 510 may be configured to operate more slowly as the memory device is held in a hold, idle, or standby state (e.g., as transistors of a DLL, clock tree, or other component associated with generating clock signals accumulates NBTI stresses).

The compare and register 525 may be an example of a component or circuitry configured to identify a degradation by comparing an operation of a monitored component of a memory device (e.g., the stressed ring oscillator 510, which in turn may be considered as a component of the memory device configured to monitor degradation another component used to support access operations or clock signal generation of the memory device) to an operation of a reference component of the memory device (e.g., the reference ring oscillator 505). For example, when the "Test" signal is disabled, each of the reference counter 515 and the stressed counter 520 may be held at a RESET state (e.g., due to an inversion of the disabled "Test" signal by the inverter 555), and accordingly each of the reference counter 515 and the stressed counter 520 may have a zero or otherwise initialized count when the "Test" signal is disabled. Upon activation of the "Test" signal (e.g., after a delay associated with the delay component 550), both the reference ring oscillator 505 and the stressed ring oscillator 510 may be activated (e.g., enabled in an oscillating state). As the last of the chained inverters of each of the reference ring oscillator and the stressed ring oscillator change states, the respective counter may accumulate counts (e.g., while the signal to the RESET input is disabled, due to an inversion of the "Test" signal by the inverter 555), which are subsequently reported to the compare and register 525. In the event that the stressed ring oscillator 510 has accumulated stress, and accordingly operates less quickly than an unstressed ring oscillator, the stressed counter 520 may register a lower count than the reference counter 515, which may not have accumulated comparable stress.

The compare and register 525 may be configured to identify a level of memory device degradation based at least in part on a difference in counts between the stressed counter 520 and the reference counter. For example, for a given duration (e.g., a duration over which the "Test" signal is activated), the compare and register 525 may output the "Flag" signal, which may be indicative of a threshold level of degradation, when the stressed counter 520 is 5% or more below the reference counter (e.g., signaling a degradation when the stressed counter 520 is at or below 95% of the reference counter). For example, in a given duration that would be associated with 100 counts of the reference counter 515, the compare and register 525 may initiate the flag signal if the stressed counter is at or below 95 counts over the given duration. Other thresholds or conditions are possible for setting the "Flag" signal in a state or level that indicates degradation of the memory device.

In some examples, the compare and register 525 may include a storage component (e.g., a non-volatile storage, a fuse) that may store an indication of such a determination. In some examples, a memory device may include such storage in a different part of the memory device. In various examples, the "Test" signal may be activated based on operating conditions of the memory device, an interval of time, or a request received from a host device. In various examples, the indication of the "Flag" signal may be provided to a host device proactively (e.g., in response to the "Flag" signal indicating degradation), or the result of the "Flag" signal may be retrieved (e.g., from a storage component) in response to a request (e.g., from a controller 320, from a host device 305). Thus, in accordance with various examples described herein, the "Flag" signal may be used to support signaling, to a host device, an indication of a degradation of a memory device based at least in part on identifying a degradation of a memory device. When the "Test" signal is deactivated (e.g., at the end of a test interval), each of the reference counter 515 and the stressed counter 520 may return to the RESET state (e.g., returning the counters to a zero or otherwise initialized state).

Figure 6:
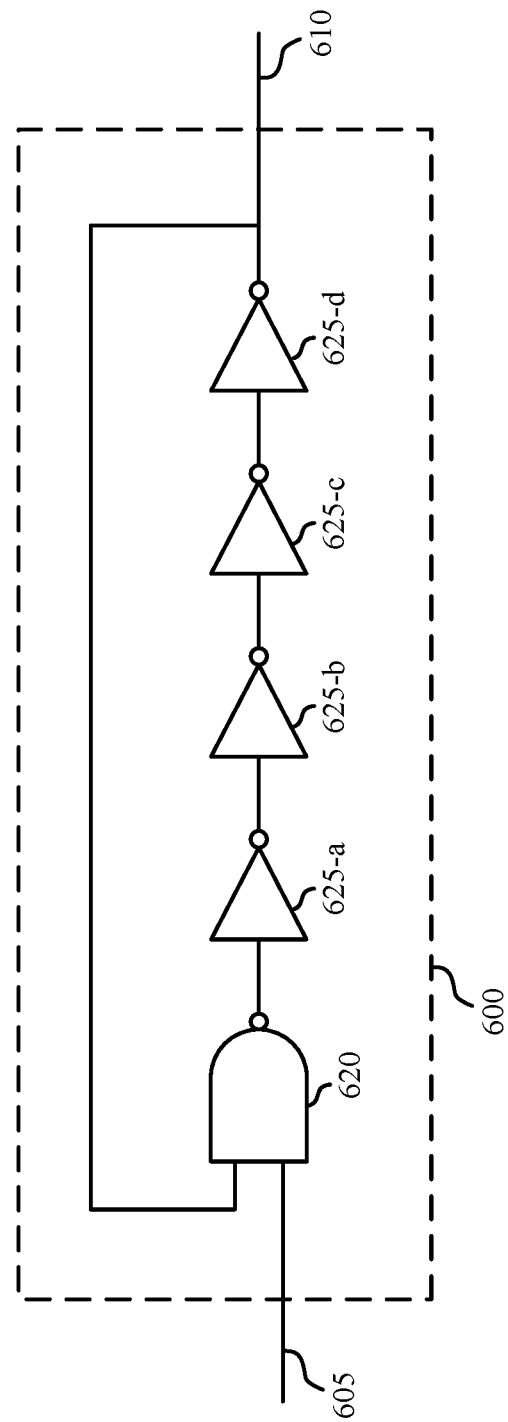
FIG. 6 illustrates an example of a ring oscillator that supports degradation signaling for a memory device in accordance with examples as disclosed herein.

FIG. 6 illustrates an example of a ring oscillator 600 that supports degradation signaling for a memory device in accordance with examples as disclosed herein. The ring oscillator 600 may include an input terminal 605 and an output terminal 610, between which a NAND gate 620 and a set of inverters 625 may be arranged in a chained arrangement. The ring oscillator 600 may be illustrative of components and features of a reference ring oscillator 405 or 505, and a stressed ring oscillator 410 or 510, described with reference to FIGS. 4 and 5. In various examples, one or more of the NAND gate 620 or the inverters 625 may include transistors (e.g., p-channel transistors, n-channel transistors, or both) or other components that accumulate stress or degradation, which may be used to simulate stress or degradation of a memory device.

In an inactive or disabled state (e.g., of the input 605), the components of the ring oscillator 600 may maintain a particular state. For example, when the input 605 is held at a disabled state or voltage, the output of the NAND gate 620 may be an enabled state or voltage. Each of the inverters may be configured to invert the state or voltage of its respective input. Thus, when the output of NAND gate 620 is an enabled state or voltage, the output of the inverter 625-a may be a disabled state or voltage, the output of the inverter 625-b may be an enabled state or voltage, the output of the inverter 625-c may be a disabled state or voltage, and the output of the inverter 625-d may be an enabled state or voltage. Thus, when the input 605 is disabled, the output 610 may be enabled. The output 610 may be fed back to the NAND gate 620 as shown, as an enabled state or voltage (e.g., as an input to the NAND gate 620), which may be associated with maintaining the enabled state or voltage of the NAND gate 620.

In an active or enabled state (e.g., of the input 605), the components of the ring oscillator 600 may be configured to each flip states in a sequential and recursive manner. For example, when the input 605 is held at an enabled state or voltage (e.g., and an initial condition of the output 610 is an enabled state or voltage, as discussed with reference to the inactive or disabled state), the output of the NAND gate 620 may be a disabled state or voltage. Thus, in a first cycle of the ring oscillator 600 in the active or enabled state, the output of the inverter 625-a may be an enabled state or voltage, the output of the inverter 625-b may be a disabled state or voltage, the output of the inverter 625-c may be an enabled state or voltage, and the output of the inverter 625-d may be a disabled state or voltage. Thus, in a first cycle of the ring oscillator 600 in the active or enabled state, when the input 605 is enabled, the output 610 may be disabled. The output 610 may be fed back to the NAND gate 620 as shown, as a disabled state or voltage (e.g., as an input to the NAND gate 620), which may be associated with the output of the NAND gate 620 switching to an enabled state or voltage. Thus, in a second cycle of the ring oscillator 600 in the active or enabled state, the output of the inverter 625-a may be a disabled state or voltage, the output of the inverter 625-b may be an enabled state or voltage, the output of the inverter 625-c may be a disabled state or voltage, and the output of the inverter 625-d may be an enabled state or voltage. Thus, in a second cycle of the ring oscillator 600 in the active or enabled state, when the input 605 is enabled, the output 610 may be enabled. The described flipping of states of components the ring oscillator 600 may continue as long as the input 605 is held at an enabled state.

In some examples, the rate at which such flipping occurs may be based at least in part on whether the components of the ring oscillator 600 have accumulated stress or degradation (e.g., in response to being activated based at least in part on row activations of a memory device, in response to being activated or powered on based at least in part on a memory device being held in an idle, hold, or standby state). Thus, the rate of operations of the ring oscillator 600 may be based at least in part on degradation, and accordingly, the ring oscillator 600 may support identification of degradation of a memory device that includes the ring oscillator 600 (e.g., in accordance with techniques described with reference to the circuits 400 and 500 of FIGS. 4 and 5).

In some examples, the ring oscillator 600 may include other terminals or components (not shown) that support applying stress to components of the ring oscillator 600. For example, the ring oscillator 600 may include terminals or components that support toggling states of inverters or transistors of the ring oscillator 600 based on operations or stresses of a memory device, such as a "TOG" terminal of the reference ring oscillator 405 or the stressed ring oscillator 410 described with reference to FIG. 4. In some examples, the ring oscillator 600 may include a power terminal (not shown) that selectively provides power (e.g., a voltage) to components of the ring oscillator 600 (e.g., to source nodes of p-channel transistors included the ring oscillator, based on a memory device being held in an idle, hold, or standby state), such as a "PWR" terminal of the reference ring oscillator 505 or the stressed ring oscillator 510 described with reference to FIG. 5.

Although illustrated as including a NAND gate 620 and four inverters 625, a ring oscillator that supports degradation monitoring and identification may include any number of components. In some examples, the NAND gate 620 may itself be considered as an inverter or inverting component, so a ring oscillator that supports the described techniques may be considered to include any odd number of inverters or inverting components. In a different interpretation, a ring oscillator that supports the described techniques may be considered as including any even number of inverters (e.g., inverters 625) in a chained configuration with a NAND gate (e.g., NAND gate 620). Although the ring oscillator 600 is illustrated as including a NAND gate 620 and inverters 625, a ring oscillator that supports the described techniques may include different components, or different arrangements of components. Moreover, ring oscillators are one example of components that may be configured to simulate degradation of another component of a memory device, or a reference component that may be used to identify degradation of a memory device.

Figure 7:
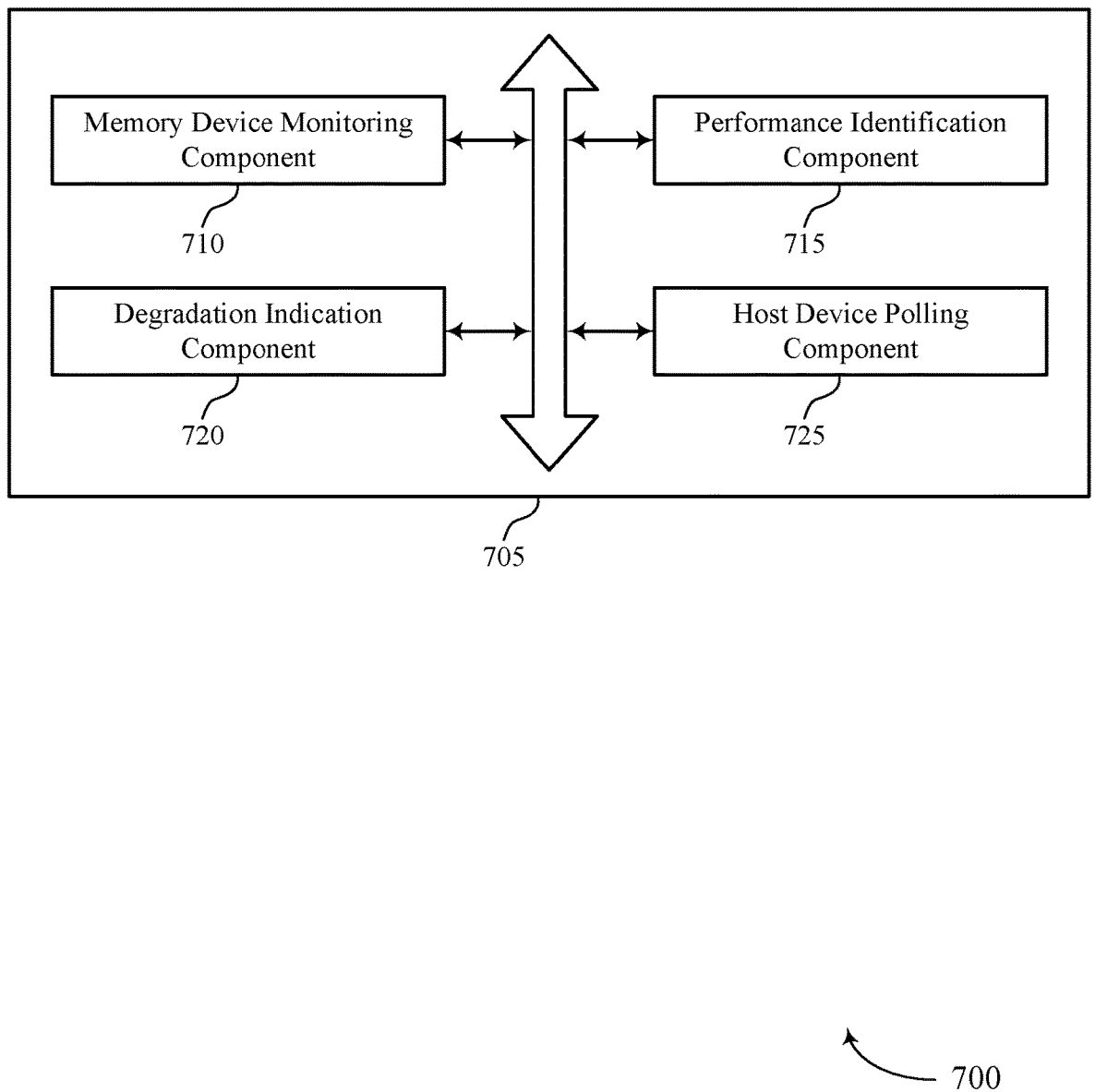
FIG. 7 shows a block diagram of a host device that supports degradation signaling for a memory device in accordance with aspects of the present disclosure.

FIG. 7 shows a block diagram 700 of a host device 705 that supports degradation signaling for a memory device in accordance with examples as disclosed herein. The host device 705 may be an example of aspects of a host device as described with reference to FIGS. 1 and 3. The host device 705 may include a memory device monitoring component 710, a performance identification component 715, a degradation indication component 720, and a host device polling component 725. Each of these modules may communicate, directly or indirectly, with one another (e.g., via one or more buses).

The memory device monitoring component 710 may monitor (e.g., receive) signaling associated with an operational characteristic of a memory device. In some examples, the memory device monitoring component 710 may monitor (e.g., receive) signaling indicative of a threshold voltage of one or more transistors of a memory device. In some examples, the memory device monitoring component 710 may receive such signaling based at least in part on a request.

In some examples, the performance identification component 715 may determine that received signaling indicates a degradation of the memory device. In some examples, the performance identification component 715 may identify, based on the monitored signaling, that the threshold voltage of a transistor (e.g., or a memory device) has changed.

The degradation indication component 720 may generate an indication associated with a degradation of the memory device based on the determining. In some examples, the degradation indication component 720 may signal, to a user, an indication associated with the degradation of the memory device.

The host device polling component 725 may transmit a request (e.g., a request for degradation information) to the memory device.

Figure 8:
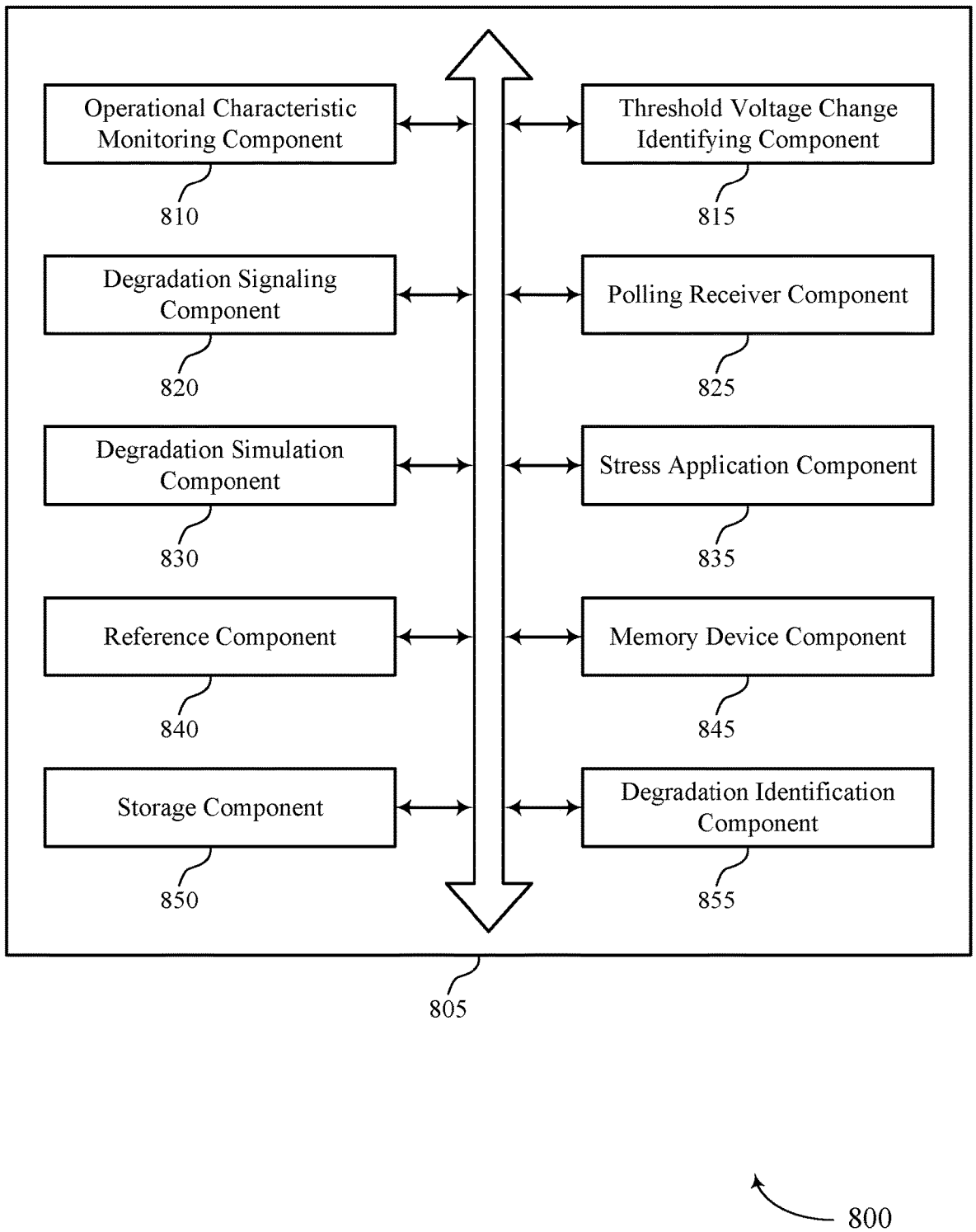
FIG. 8 shows a block diagram of a memory device that supports degradation signaling for a memory device in accordance with aspects of the present disclosure.

FIG. 8 shows a block diagram 800 of a memory device 805 that supports degradation signaling for a memory device in accordance with examples as disclosed herein. The memory device 805 may be an example of aspects of a memory device 110 or 310 as described with reference to FIGS. 1 and 3. The memory device 805 may include an operational characteristic monitoring component 810, a threshold voltage change identifying component 815, a degradation signaling component 820, a polling receiver component 825, a degradation simulation component 830, a stress application component 835, a reference component 840, a memory device component 845, a storage component 850, and a degradation identification component 855. Each of these modules may communicate, directly or indirectly, with one another (e.g., via one or more buses).

The operational characteristic monitoring component 810 may monitor an operational characteristic of the memory device. In some examples, the operational characteristic monitoring component 810 may monitor a threshold voltage associated with one or more transistors (e.g., an NMOS transistor, a PMOS transistor) of the memory device. In some examples, the operational characteristic monitoring component 810 may compare the threshold voltage to a reference voltage. In some examples, the operational characteristic monitoring component 810 may identify a change of the threshold voltage based on monitoring a component of the memory device configured to simulate degradation of another component of the memory device. In some examples, the operational characteristic monitoring component 810 may monitor a component of the memory device that is used for accessing a row of memory cells of the memory device or for generating a clock signal (e.g., a data strobe signal) for the memory device.

In some examples, the threshold voltage change identifying component 815 may identify, at the memory device, a change of a threshold voltage (e.g., of one or more transistors of the memory device) based on a monitoring. In some examples, the threshold voltage change identifying component 815 may determine that a threshold voltage of a transistor of the memory device satisfies a threshold. In some examples, the threshold voltage change identifying component 815 may determine that the change of the threshold voltage of the transistor exceeds a threshold change.

In some examples, the threshold voltage change identifying component 815 may identify a physical degradation of a component of the memory device based on the monitored threshold voltage. For example, the threshold voltage change identifying component 815 may identify an indication that a transistor of the memory device has experienced channel hot carrier stress degradation, bias temperature instability degradation, or a combination thereof. In some examples, the threshold voltage change identifying component 815 may determine that a monitored threshold voltage satisfies a threshold, and signaling may be initiated based on the determining.

The degradation signaling component 820 may signal, to a host device, an indication of a degradation of a memory device (e.g., based on identifying a degradation). In some examples, the degradation signaling component 820 may signal, to a host device, an indication of the degradation. In some examples, the degradation signaling component 820 may signal that the memory device is operating in a degraded condition. In some examples, the degradation signaling component 820 may transmit the indication over a data channel between the memory device and the host device, or a Joint Test Action Group (JTAG) channel between the memory device and the host device. In some examples, the degradation signaling component 820 may initiate the signaling based on a degradation of the memory device being identified. In some cases, the signaling may be initiated based on identifying a change of the threshold voltage.

The degradation identification component 855 may identify, at the memory device, a degradation of the memory device based on the monitored operational characteristic. In some examples, the degradation identification component 855 may identify a physical degradation of a component of the memory device based on the monitored operational characteristic. In some examples, the degradation identification component 855 may identify an indication that a transistor of the memory device has experienced channel hot carrier stress degradation, bias temperature instability degradation, or a combination thereof. In some examples, the degradation identification component 855 may determine that a threshold voltage of a transistor of the memory device satisfies a threshold.

In some examples, the degradation identification component 855 may initiate the identifying based on to the received request. In some examples, the degradation identification component 855 may determine that the monitored operational characteristic satisfies a threshold, where identifying the degradation is based on the determining.

In some examples, the degradation identification component 855 may identify the degradation of the memory device is based on monitoring a component of the memory device configured to simulate a degradation of another component of the memory device. In some examples, the degradation identification component 855 may compare an operational characteristic of the component of the memory device to the operational characteristic of a reference component of the memory device.

The polling receiver component 825 may receive a request from a host device, and identifying a degradation of the memory device may be responsive to the received request. In some examples, the polling receiver component 825 may receive a request from a host device, and signaling an indication of a degradation may be initiated based on to the received request.

The degradation simulation component 830 may be an example of, or otherwise include a component of the memory device that is configured to simulate a degradation of one or more other components of the memory device. In some examples, the degradation simulation component 830 may apply a stress to the component of the memory device based on a delay-locked loop within the memory device being in a hold mode or a standby mode. In some cases, the degradation simulation component 830 is configured to simulate a degradation of one or more transistors for selecting an access line of the memory device, or a component used to generate a clock signal within the memory device, or a delay-locked loop component of the memory device, or some combination thereof. In some cases, the component of the memory device is configured to simulate a CHC degradation, an NBTI degradation, or some combination thereof.

The stress application component 835 may apply a stress to the component of the memory device based on a row of memory cells within the memory device being activated, a delay-locked loop within the memory device being in a hold mode or a standby mode, or a component of a clock tree within the memory device being in a hold mode or a standby mode. In some examples, the stress application component 835 may activate the component of the memory device based on a row of memory cells within the memory device being accessed. In some examples, the stress application component 835 may activate the component of the memory device based on a delay-locked loop within the memory device being in a standby mode. In some examples, the stress application component 835 may activate the component of the memory device based on a component of a clock tree within the memory device being in a standby mode.

The reference component 840 may compare an operational characteristic of the component of the memory device to the operational characteristic of a reference component of the memory device.

In some examples, the operational characteristic monitoring component 810 may monitor a transistor of the memory device that is used for accessing a row of memory cells of the memory device or for generating a clock signal for the memory device (e.g., a memory device component 845). In some examples, the operational characteristic monitoring component 810 may compare the threshold voltage to a reference voltage (e.g., a memory device component 845). In some examples, the memory device may continue to operate the memory device the degradation of the memory device is signaled.

The storage component 850 may store, at the memory device, a result of identifying a degradation. In some cases, a result of the identifying is stored in a non-volatile memory of the memory device. In other words, the result of the determination may be stored in a non-volatile memory of the memory device.

Figure 9:
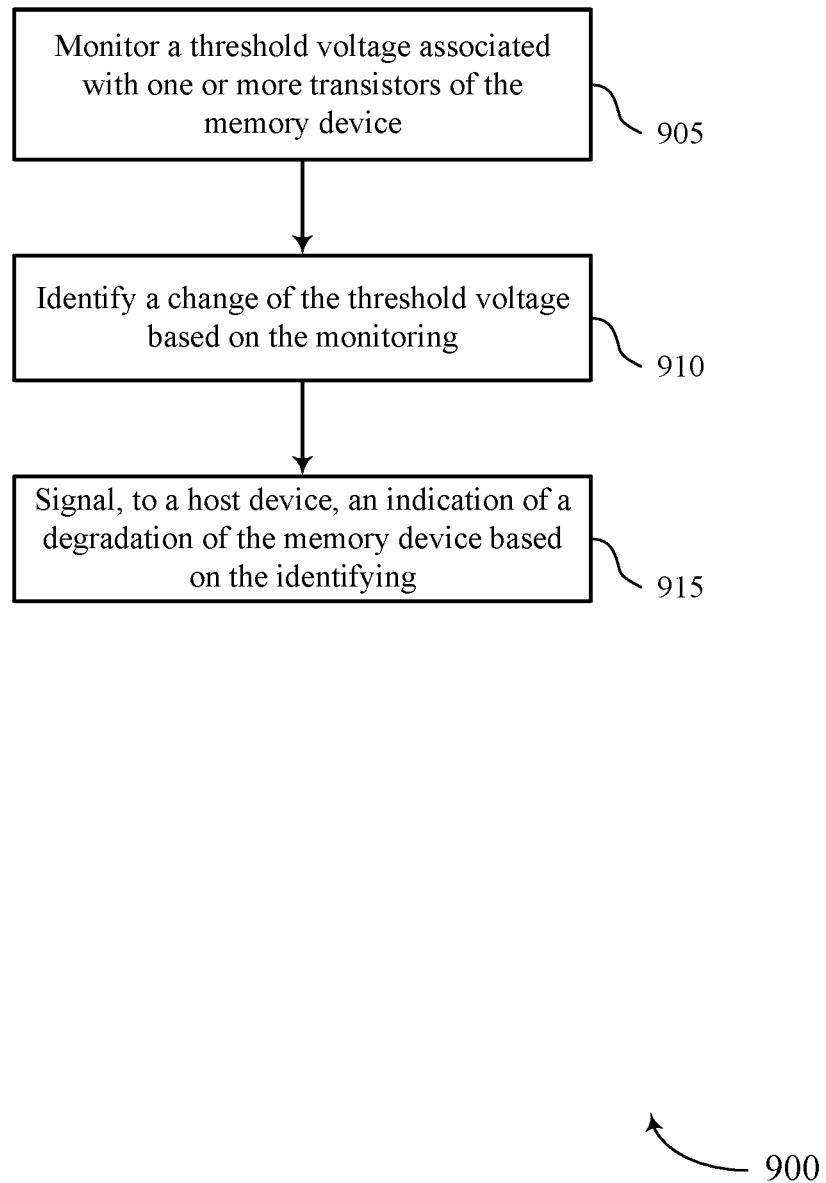
FIGS. 9 through 13 show flowcharts illustrating a method or methods that support degradation signaling for a memory device in accordance with examples as disclosed herein.

FIG. 9 shows a flowchart illustrating a method or methods 900 that supports degradation signaling for a memory device in accordance with aspects of the present disclosure. The operations of method 900 may be implemented by a memory device or its components as described herein. For example, the operations of method 900 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 905, the memory device may monitor a threshold voltage associated with one or more transistors of the memory device. The operations of 905 may be performed according to the methods described herein. In some examples, aspects of the operations of 905 may be performed by an operational characteristic monitoring component as described with reference to FIG. 8.

At 910, the memory device may identify a change of the threshold voltage based on the monitoring. The operations of 910 may be performed according to the methods described herein. In some examples, aspects of the operations of 910 may be performed by a threshold voltage change identifying component as described with reference to FIG. 8.

At 915, the memory device may signal, to a host device, an indication of a degradation of the memory device based on the identifying. The operations of 915 may be performed according to the methods described herein. In some examples, aspects of the operations of 915 may be performed by a degradation signaling component as described with reference to FIG. 8.

In some examples, an apparatus as described herein may perform a method or methods, such as the method 900. The apparatus may include features, means, circuitry, or instructions (e.g., a non-transitory computer-readable medium storing instructions executable by a processor) for monitoring, at a memory device, a threshold voltage associated with one or more transistors of the memory device, identifying, at the memory device, a change of the threshold voltage based on the monitoring, and signaling, to a host device, an indication of a degradation of the memory device based on the identifying.

Some examples of the method 900 and the apparatus described herein may further include operations, features, means, circuitry, or instructions for receiving a request from a host device, where the identifying may be responsive to the received request.

Some examples of the method 900 and the apparatus described herein may further include operations, features, means, circuitry, or instructions for determining that the monitored threshold voltage satisfies a threshold, where the signaling may be initiated based on the determining.

In some examples of the method 900 and the apparatus described herein, monitoring the threshold voltage may include operations, features, means, circuitry, or instructions for monitoring a component of the memory device that may be configured to simulate a degradation of one or more other components of the memory device, and identifying the change of the threshold voltage may be based on monitoring the component of the memory device.

In some examples of the method 900 and the apparatus described herein, the component of the memory device may be configured to simulate a degradation of one or more transistors for selecting an access line of the memory device.

In some examples of the method 900 and the apparatus described herein, the component of the memory device may be configured to simulate a degradation of a component used to generate a clock signal within the memory device.

In some examples of the method 900 and the apparatus described herein, the component of the memory device may be configured to simulate a degradation of a delay-locked loop component of the memory device.

In some examples of the method 900 and the apparatus described herein, the component of the memory device may be configured to simulate a CHC degradation of the memory device.

In some examples of the method 900 and the apparatus described herein, the component of the memory device may be configured to simulate an NBTI degradation of the memory device.

In some examples of the method 900 and the apparatus described herein, the one or more other components may be used for accessing a row of memory cells of the memory device or for generating a clock signal of the memory device.

In some examples of the method 900 and the apparatus described herein, the clock signal may be a data strobe signal of the memory device.

In some examples of the method 900 and the apparatus described herein, the clock signal may be based on, or generated by, a clock tree of the memory device.

Some examples of the method 900 and the apparatus described herein may further include operations, features, means, circuitry, or instructions for applying a stress to the component of the memory device based on a row of memory cells within the memory device being activated, a delay-locked loop within the memory device being in a hold mode or a standby mode, or a component of a clock tree within the memory device being in a hold mode or a standby mode.

Some examples of the method 900 and the apparatus described herein may further include operations, features, means, circuitry, or instructions for activating the component of the memory device based on a row of memory cells within the memory device being accessed.

Some examples of the method 900 and the apparatus described herein may further include operations, features, means, circuitry, or instructions for activating the component of the memory device based on a delay-locked loop within the memory device being in a standby mode.

Some examples of the method 900 and the apparatus described herein may further include operations, features, means, circuitry, or instructions for activating the component of the memory device based on a component of a clock tree within the memory device being in a standby mode.

In some examples of the method 900 and the apparatus described herein, identifying the change of the threshold voltage may include operations, features, means, circuitry, or instructions for comparing an operational characteristic of the component of the memory device to the operational characteristic of a reference component of the memory device.

In some examples of the method 900 and the apparatus described herein, monitoring the threshold voltage may include operations, features, means, circuitry, or instructions for monitoring a transistor of the memory device that may be used for accessing a row of memory cells of the memory device or for generating a clock signal for the memory device.

In some examples of the method 900 and the apparatus described herein, the clock signal may be a data strobe signal of the memory device.

In some examples of the method 900 and the apparatus described herein, the clock signal may be based on, or generated by, a clock tree of the memory device.

In some examples of the method 900 and the apparatus described herein, monitoring the threshold voltage may include operations, features, means, circuitry, or instructions for comparing the threshold voltage to a reference voltage.

In some examples of the method 900 and the apparatus described herein, the transistor may be an NMOS transistor.

In some examples of the method 900 and the apparatus described herein, the transistor may be a PMOS transistor.

In some examples of the method 900 and the apparatus described herein, the identifying may include operations, features, means, circuitry, or instructions for determining that a threshold voltage of a transistor of the memory device satisfies a threshold.

In some examples of the method 900 and the apparatus described herein, the identifying may include operations, features, means, circuitry, or instructions for determining that the change of the threshold voltage of the transistor exceeds a threshold change.

In some examples of the method 900 and the apparatus described herein, the signaling may include operations, features, means, circuitry, or instructions for signaling that the memory device may be operating in a degraded condition.

In some examples of the method 900 and the apparatus described herein, the signaling may include operations, features, means, circuitry, or instructions for transmitting the indication over a data channel between the memory device and the host device.

In some examples of the method 900 and the apparatus described herein, the signaling may include operations, features, means, circuitry, or instructions for transmitting the indication over a Joint Test Action Group (JTAG) channel between the memory device and the host device.

Some examples of the method 900 and the apparatus described herein may further include operations, features, means, circuitry, or instructions for storing, at the memory device, a result of the identifying.

In some examples of the method 900 and the apparatus described herein, the identifying may include operations, features, means, circuitry, or instructions for identifying an indication that a transistor of the memory device may have experienced channel hot carrier stress degradation, bias temperature instability degradation, or a combination thereof.

In some examples of the method 900 and the apparatus described herein, a result of the identifying may be stored in a non-volatile memory of the memory device.

In some examples of the method 900 and the apparatus described herein, the identifying may include operations, features, means, circuitry, or instructions for identifying a physical degradation of a component of the memory device based on the monitored threshold voltage.

Some examples of the method 900 and the apparatus described herein may further include operations, features, means, circuitry, or instructions for receiving a request from a host device, where the signaling may be initiated based on to the received request.

In some examples of the method 900 and the apparatus described herein, the signaling may be initiated based on identifying the change of the threshold voltage.

Some examples of the method 900 and the apparatus described herein may further include operations, features, means, circuitry, or instructions for continuing to operate the memory device after signaling the indication of the degradation of the memory device.

Figure 10:
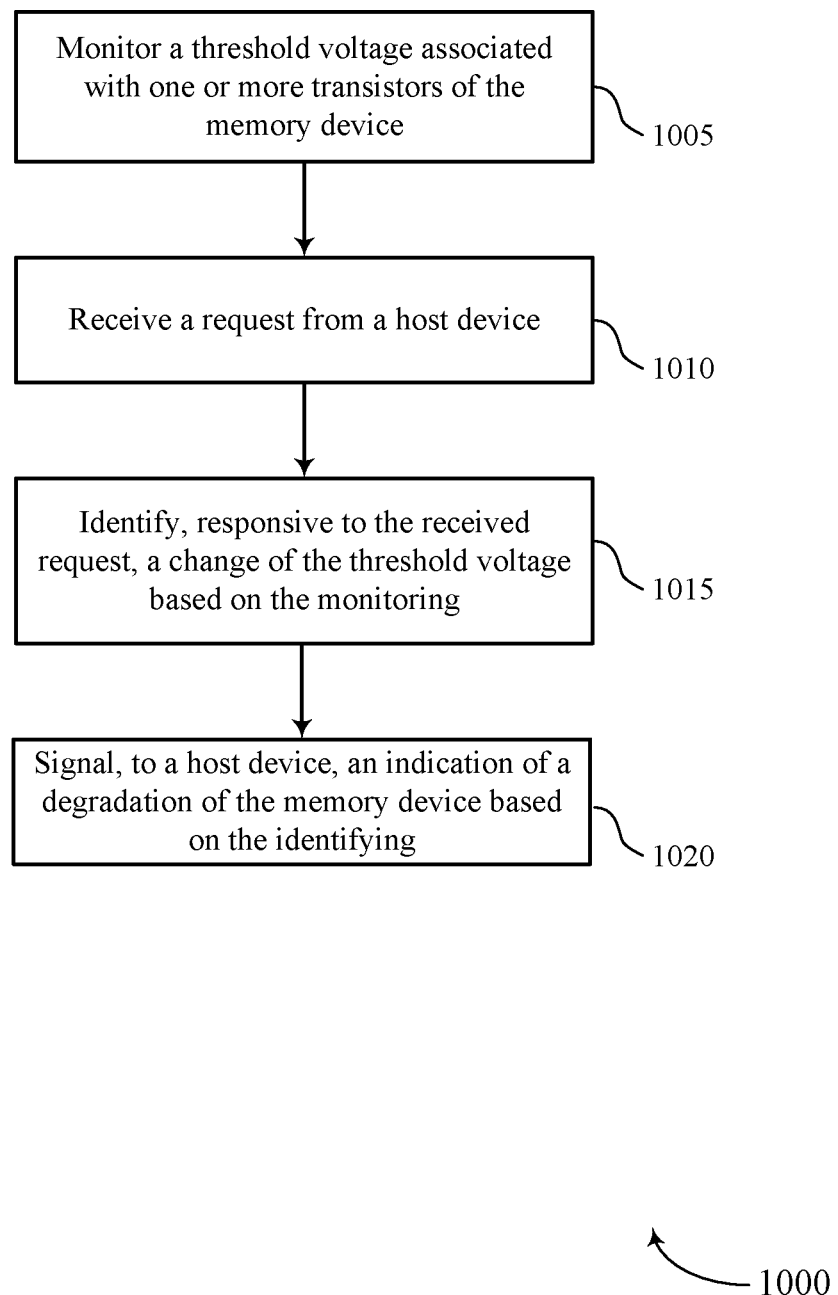

FIG. 10 shows a flowchart illustrating a method or methods 1000 that supports degradation signaling for a memory device in accordance with aspects of the present disclosure. The operations of method 1000 may be implemented by a memory device or its components as described herein. For example, the operations of method 1000 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1005, the memory device may monitor a threshold voltage associated with one or more transistors of the memory device. The operations of 1005 may be performed according to the methods described herein. In some examples, aspects of the operations of 1005 may be performed by an operational characteristic monitoring component as described with reference to FIG. 8.

At 1010, the memory device may receive a request from a host device. The operations of 1010 may be performed according to the methods described herein. In some examples, aspects of the operations of 1010 may be performed by a polling receiver component as described with reference to FIG. 8.

At 1015, the memory device may identify, responsive to the received request, a change of the threshold voltage based on the monitoring. The operations of 1015 may be performed according to the methods described herein. In some examples, aspects of the operations of 1015 may be performed by a threshold voltage change identifying component as described with reference to FIG. 8.

At 1020, the memory device may signal, to a host device, an indication of a degradation of the memory device based on the identifying. The operations of 1020 may be performed according to the methods described herein. In some examples, aspects of the operations of 1020 may be performed by a degradation signaling component as described with reference to FIG. 8.

Figure 11:
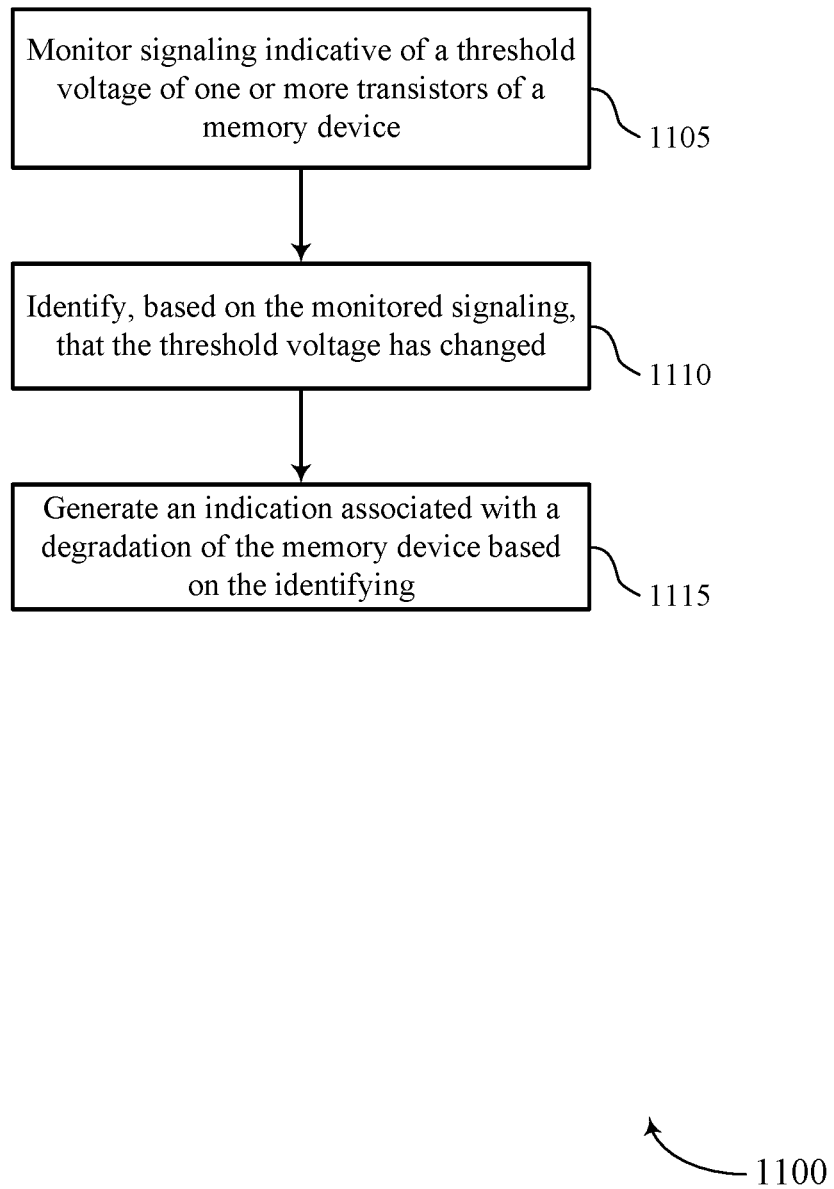

FIG. 11 shows a flowchart illustrating a method or methods 1100 that supports degradation signaling for a memory device in accordance with aspects of the present disclosure. The operations of method 1100 may be implemented by a host device or its components as described herein. For example, the operations of method 1100 may be performed by a host device as described with reference to FIG. 7. In some examples, a host device may execute a set of instructions to control the functional elements of the host device to perform the described functions. Additionally or alternatively, a host device may perform aspects of the described functions using special-purpose hardware.

At 1105, the host device may monitor signaling indicative of a threshold voltage of one or more transistors of a memory device. The operations of 1105 may be performed according to the methods described herein. In some examples, aspects of the operations of 1105 may be performed by a memory device monitoring component as described with reference to FIG. 7.

At 1110, the host device may identify, based on the monitored signaling, that the threshold voltage has changed. The operations of 1110 may be performed according to the methods described herein. In some examples, aspects of the operations of 1110 may be performed by a performance identification component as described with reference to FIG. 7.

At 1115, the host device may generate an indication associated with a degradation of the memory device based on the identifying. The operations of 1115 may be performed according to the methods described herein. In some examples, aspects of the operations of 1115 may be performed by a degradation indication component as described with reference to FIG. 7.

In some examples, an apparatus as described herein may perform a method or methods, such as the method 1100. The apparatus may include features, means, circuitry, or instructions (e.g., a non-transitory computer-readable medium storing instructions executable by a processor) for monitoring, at a host device, signaling indicative of a threshold voltage of one or more transistors of a memory device, identifying, based on the monitored signaling, that the threshold voltage has changed, and generating an indication associated with a degradation of the memory device based on the determining.

In some examples of the method 1100 and the apparatus described herein, the monitoring may include operations, features, means, circuitry, or instructions for transmitting a request to the memory device, and receiving the signaling based on the request.

Figure 12:
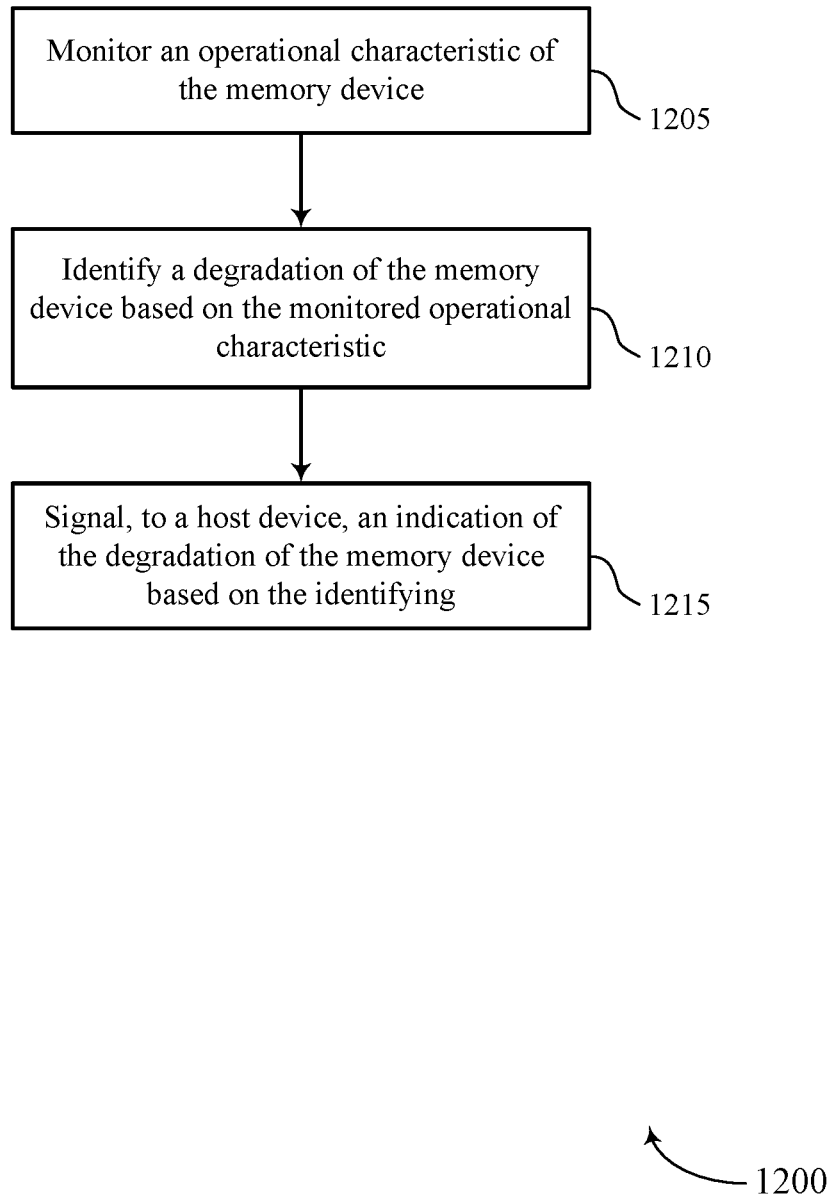

FIG. 12 shows a flowchart illustrating a method or methods 1200 that supports degradation signaling for a memory device in accordance with aspects of the present disclosure. The operations of method 1200 may be implemented by a memory device or its components as described herein. For example, the operations of method 1200 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1205, the memory device may monitor an operational characteristic of the memory device. The operations of 1205 may be performed according to the methods described herein. In some examples, aspects of the operations of 1205 may be performed by an operational characteristic monitoring component as described with reference to FIG. 8.

At 1210, the memory device may identify a degradation of the memory device based on the monitored operational characteristic. The operations of 1210 may be performed according to the methods described herein. In some examples, aspects of the operations of 1210 may be performed by a degradation identification component as described with reference to FIG. 8.

At 1215, the memory device may signal, to a host device, an indication of the degradation of the memory device based on the identifying. The operations of 1215 may be performed according to the methods described herein. In some examples, aspects of the operations of 1215 may be performed by a degradation signaling component as described with reference to FIG. 8.

In some examples, an apparatus as described herein may perform a method or methods, such as the method 1200. The apparatus may include features, means, circuitry, or instructions (e.g., a non-transitory computer-readable medium storing instructions executable by a processor) for monitoring, at a memory device, an operational characteristic of the memory device, identifying, at the memory device, a degradation of the memory device based on the monitored operational characteristic, and signaling, to a host device, an indication of the degradation of the memory device based on the identifying.

In some examples of the method 1200 and the apparatus described herein, the identifying may include operations, features, means, circuitry, or instructions for identifying a physical degradation of a component of the memory device based on the monitored operational characteristic. For example, the identifying may include operations, features, means, circuitry, or instructions for identifying an indication that a transistor of the memory device may have experienced channel hot carrier stress degradation, bias temperature instability degradation, or a combination thereof. In some examples of the method 1200 and the apparatus described herein, the signaling may include operations, features, means, circuitry, or instructions for signaling that the memory device may be operating in a degraded condition.

Some examples of the method 1200 and the apparatus described herein may further include operations, features, means, circuitry, or instructions for determining that the monitored operational characteristic satisfies a threshold, and identifying the degradation, or initiating the signaling, may be based on the determining.

In some examples of the method 1200 and the apparatus described herein, monitoring the operational characteristic may include operations, features, means, circuitry, or instructions for monitoring a component of the memory device that may be configured to simulate a degradation of one or more other components of the memory device (e.g., a component used for accessing a row of memory cells of the memory device, a component used for generating a clock signal of the memory device), and identifying the degradation of the memory device may be based on monitoring the component of the memory device.

In various examples, the component of the memory device may be configured to simulate a degradation of one or more transistors for selecting an access line of the memory device, a degradation of a component used to generate a clock signal (e.g., a data strobe signal) within the memory device, a degradation of a delay-locked loop component of the memory device, or others. In various examples, the component of the memory device may be configured to simulate a CHC degradation of the memory device, an NBTI degradation of the memory device, or a combination thereof.

Some examples of the method 1200 and the apparatus described herein may further include operations, features, means, circuitry, or instructions for applying a stress to the component of the memory device based on accessing a row of memory cells within the memory device. Some examples of the method 1200 and the apparatus described herein may further include operations, features, means, circuitry, or instructions for applying a stress to the component of the memory device based on a delay-locked loop or a component of a clock tree within the memory device being in a hold mode or a standby mode.

In some examples of the method 1200 and the apparatus described herein, identifying the degradation of the memory device may include operations, features, means, circuitry, or instructions for comparing the operational characteristic of the component of the memory device (e.g., that is configured to simulate a degradation) to the operational characteristic of a reference component of the memory device.

In some examples of the method 1200 and the apparatus described herein, monitoring the operational characteristic of the memory device may include operations, features, means, circuitry, or instructions for monitoring (e.g., directly) a component of the memory device that may be used for accessing a row of memory cells of the memory device or for generating a clock signal for the memory device.

In some examples of the method 1200 and the apparatus described herein, the monitoring may include operations, features, means, circuitry, or instructions for monitoring a threshold voltage of a transistor of the memory device. In some examples, monitoring the threshold voltage may include operations, features, means, circuitry, or instructions for comparing the threshold voltage to a reference voltage.

In some examples, the identifying the degradation of the memory device may include operations, features, means, circuitry, or instructions for determining that a threshold voltage of a transistor of the memory device satisfies a threshold. In some examples, identifying the degradation of the memory device may include operations, features, means, circuitry, or instructions for identifying a change of a threshold voltage of a transistor of the memory device (e.g., a PMOS transistor, an NMOS transistor). In some examples, identifying the degradation of the memory device may include operations, features, means, circuitry, or instructions for determining that the change in threshold voltage of the transistor exceeds a threshold change.

In some examples of the method 1200 and the apparatus described herein, the signaling may include operations, features, means, circuitry, or instructions for transmitting the indication over a data channel between the memory device and the host device, or over a Joint Test Action Group (JTAG) channel between the memory device and the host device, or some other channel.

Some examples of the method 1200 and the apparatus described herein may further include operations, features, means, circuitry, or instructions for storing, at the memory device, a result of the identifying. For example, result of the identification may be stored in a non-volatile memory of the memory device.

Some examples of the method 1200 and the apparatus described herein may further include operations, features, means, circuitry, or instructions for receiving a request from a host device, and initiating the identifying based on to the received request. Some examples of the method 1200 and the apparatus described herein may further include operations, features, means, circuitry, or instructions for receiving a request from a host device, where the signaling may be initiated based on to the received request. In some examples, the signaling may be initiated based on identifying the degradation of the memory device.

Figure 13:
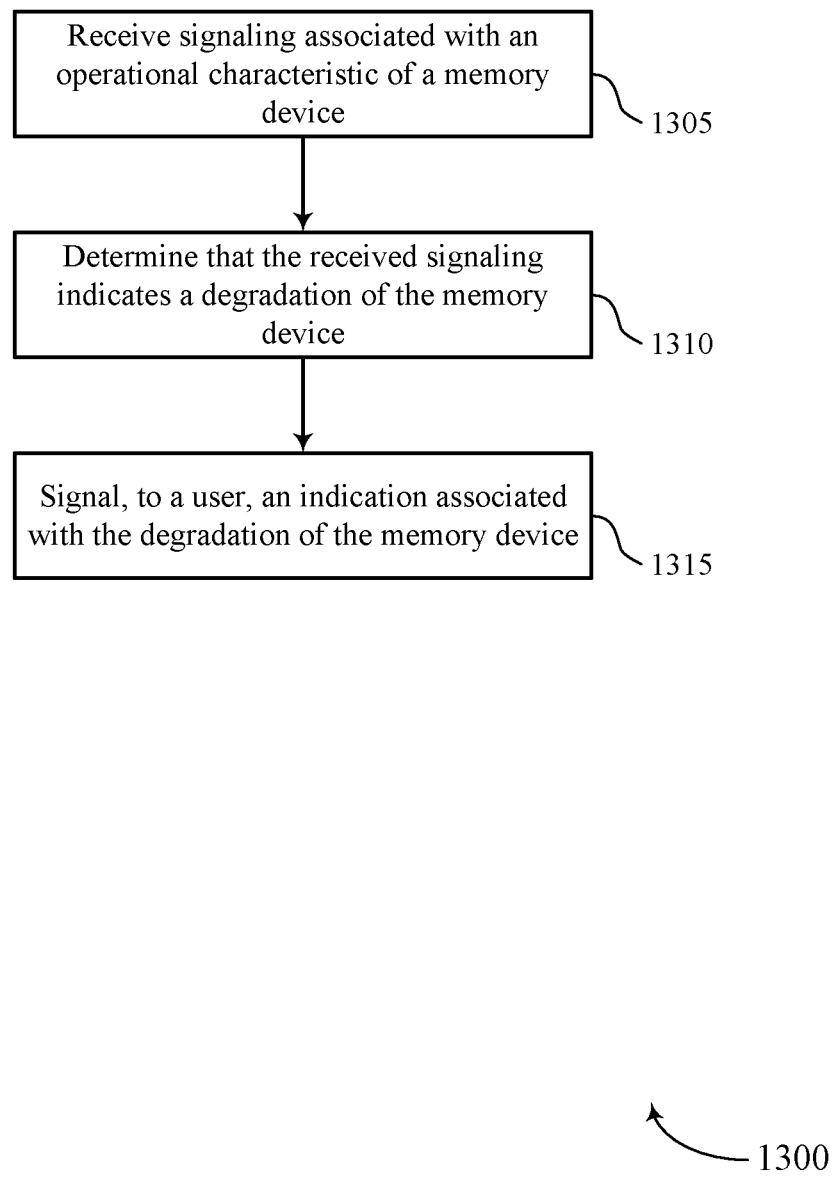

FIG. 13 shows a flowchart illustrating a method or methods 1300 that supports degradation signaling for a memory device in accordance with aspects of the present disclosure. The operations of method 1300 may be implemented by a host device or its components as described herein. For example, the operations of method 1300 may be performed by a host device as described with reference to FIG. 7. In some examples, a host device may execute a set of instructions to control the functional elements of the host device to perform the described functions. Additionally or alternatively, a host device may perform aspects of the described functions using special-purpose hardware.

At 1305, the host device may receive signaling associated with an operational characteristic of a memory device. The operations of 1305 may be performed according to the methods described herein. In some examples, aspects of the operations of 1305 may be performed by a memory device monitoring component as described with reference to FIG. 7.

At 1310, the host device may determine that the received signaling indicates a degradation of the memory device. The operations of 1310 may be performed according to the methods described herein. In some examples, aspects of the operations of 1310 may be performed by a performance identification component as described with reference to FIG. 7.

At 1315, the host device may signal, to a user, an indication associated with the degradation of the memory device. The operations of 1315 may be performed according to the methods described herein. In some examples, aspects of the operations of 1315 may be performed by a degradation indication component as described with reference to FIG. 7.

In some examples, an apparatus as described herein may perform a method or methods, such as the method 1300. The apparatus may include features, means, circuitry, or instructions (e.g., a non-transitory computer-readable medium storing instructions executable by a processor) for receiving, at a host device, signaling associated with an operational characteristic of a memory device, determining that the received signaling indicates a degradation of the memory device, and signaling, to a user, an indication associated with the degradation of the memory device.

In some examples of the method 1300 and the apparatus described herein, the monitoring may include operations, features, means, circuitry, or instructions for transmitting a request to the memory device, and receiving the signaling associated with the operational characteristic of the memory device may be based on the request.

It should be noted that the described methods include possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or other feature that provides a conductive path between elements or components of memory array.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. With the guidance of the present disclosure, various modifications to the described techniques will be apparent to those skilled in the art, and the principles defined herein may be applied to other variations or equivalents without departing from the scope of the disclosure. Thus, the disclosure is not limited to the examples and designs described herein but is to be accorded the broadest scope consistent with the principles and novel features disclosed herein.

What is claimed is:

1. A method comprising:
monitoring, at a memory device having a memory array, a threshold voltage of one or more simulation transistors of the memory device that are included in sensing circuitry or decoding circuitry for accessing the memory array, wherein the one or more simulation transistors of the memory device are configured to simulate a degradation of one or more other components of the memory device;
identifying, at the memory device, a change of the threshold voltage of the one or more simulation transistors included in the sensing circuitry or the decoding circuitry for accessing the memory array based at least in part on monitoring the one or more simulation transistors, wherein identifying the change of the threshold voltage of the one or more simulation transistors comprises comparing an operational characteristic of the one or more simulation transistors to an operational characteristic of a reference component of the memory device; and
signaling, by the memory device and to a host device, an indication of a degradation of the sensing circuitry or the decoding circuitry for accessing the memory array based at least in part on the identifying, wherein the memory array is accessible after the signaling.

2. The method of claim 1, further comprising:
determining that the monitored threshold voltage satisfies a threshold, wherein the signaling is initiated based at least in part on the determining.

3. The method of claim 1, further comprising:
activating the one or more simulation transistors of the memory device that are configured to simulate the degradation based at least in part on a row of memory cells within the memory device being accessed.

4. The method of claim 1, further comprising:
activating the one or more simulation transistors of the memory device that are configured to simulate the degradation based at least in part on a delay-locked loop within the memory device being in a standby mode.

5. The method of claim 1, further comprising:
activating the one or more simulation transistors of the memory device that are configured to simulate the degradation based at least in part on a component of a clock tree within the memory device being in a standby mode.

6. The method of claim 1, wherein monitoring the threshold voltage comprises:
monitoring a transistor of the memory device that is used for accessing a row of memory cells of the memory device or for generating a clock signal for the memory device.

7. The method of claim 1, further comprising:
receiving, from the host device, a request for degradation information associated with the threshold voltage, wherein signaling the indication of the degradation of the sensing circuitry or the decoding circuitry of the memory device is based at least in part on receiving the request for the degradation information.

8. The method of claim 1, wherein the one or more other components comprise one or more transistors of the memory device, a delay-locked loop associated with the memory device, a clock tree of the memory device, or a combination thereof.

9. An apparatus comprising:
a memory device having a memory array comprising a plurality of memory cells; and
circuitry configured to:
monitor a threshold voltage of one or more simulation transistors of the memory device that are included in sensing circuitry or decoding circuitry for accessing the memory array, wherein the one or more simulation transistors of the memory device are configured to simulate a degradation of one or more other components of the memory device;
identify, a change of the threshold voltage of the one or more simulation transistors included in the sensing circuitry or the decoding circuitry for accessing the memory array based at least in part on monitoring the one or more simulation transistors, and based at least in part on comparing an operational characteristic of the one or more simulation transistors to an operational characteristic of a reference component of the memory device; and
signal, to a host device, an indication of a degradation of the sensing circuitry or the decoding circuitry for accessing the memory array based at least in part on the identifying, wherein the memory array is accessible after the signaling.

10. The apparatus of claim 9, wherein the one or more simulation transistors of the memory device that are configured to simulate the degradation is configured to simulate a channel hot carrier (CHC) degradation of the memory device or a negative bias temperature instability (NBTI) degradation of the memory device.

11. The apparatus of claim 9, wherein the one or more simulation transistors of the memory device that are configured to simulate the degradation are associated with a ring oscillator.

12. The apparatus of claim 11, wherein, to monitor the threshold voltage, the circuitry is configured to:
compare an operation of the ring oscillator to a second operation of a second ring oscillator.

13. The apparatus of claim 11, wherein the circuitry is configured to:
activate the ring oscillator based at least in part on a row of memory cells within the memory device being accessed.

14. The apparatus of claim 11, wherein the circuitry is configured to:
activate the ring oscillator based at least in part on a delay-locked loop within the memory device being operated in a standby mode or a clock tree within the memory device being operated in a standby mode.

15. The apparatus of claim 9, further comprising:
a storage component of the memory device configured to store a result of the identifying.

16. The apparatus of claim 9, wherein the circuitry is further configured to:
receive, from the host device, a request for degradation information associated with the threshold voltage, wherein signaling the indication of the degradation of the sensing circuitry or the decoding circuitry of the memory device is based at least in part on receiving the request for the degradation information.

17. A method comprising:
receiving, at a host device, signaling from a memory device indicative of a threshold voltage of one or more simulation transistors of the memory device that are external to a memory array of the memory device and that are included in sensing circuitry or decoding circuitry for accessing the memory array of the memory device, wherein the signaling indicates a degradation of one or more other components of the memory device;
identifying, at the host device and based at least in part on receiving the signaling, that the threshold voltage of the one or more simulation transistors included in the sensing circuitry or the decoding circuitry for accessing the memory array has changed, wherein identifying that the threshold voltage of the one or more simulation transistors included in the sensing circuitry or the decoding circuitry for accessing the memory array has changed comprises comparing an operational characteristic of the one or more simulation transistors to an operational characteristic of a reference component of the memory device;
generating, at the host device, an indication associated with a degradation of the sensing circuitry or the decoding circuitry for accessing the memory array based at least in part on the identifying; and
performing one or more access operations on the memory array based at least in part on generating the indication associated with the degradation of the sensing circuitry or the decoding circuitry.

18. The method of claim 17, further comprising:
transmitting, to the memory device, a request for degradation information associated with the threshold voltage, wherein receiving the signaling from the memory device is based at least in part on transmitting the request for the degradation information.

* * * * *